United States Patent
Hong et al.

(10) Patent No.: US 10,886,255 B2
(45) Date of Patent: Jan. 5, 2021

(54) DIE STACK STRUCTURE, SEMICONDUCTOR PACKAGE HAVING THE SAME AND METHOD OF MANUFACTURING THE SAME

(71) Applicant: Samsung Electronics Co., Ltd., Suwon-si (KR)

(72) Inventors: Ji-Seok Hong, Yongin-si (KR); Ji-Hoon Kim, Asan-si (KR); Tae-Hun Kim, Asan-si (KR); Hyuek-Jae Lee, Hwaseong-si (KR); Ji-Hwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/532,598

(22) Filed: Aug. 6, 2019

(65) Prior Publication Data

US 2020/0135698 A1 Apr. 30, 2020

(30) Foreign Application Priority Data

Oct. 30, 2018 (KR) .................. 10-2018-0131220

(51) Int. Cl.
| | |
|---|---|
| H01L 25/065 | (2006.01) |
| H01L 23/31 | (2006.01) |
| H01L 23/538 | (2006.01) |
| H01L 23/00 | (2006.01) |
| H01L 23/48 | (2006.01) |
| H01L 21/56 | (2006.01) |
| H01L 21/822 | (2006.01) |

(52) U.S. Cl.
CPC .......... *H01L 25/0657* (2013.01); *H01L 21/56* (2013.01); *H01L 21/8221* (2013.01); *H01L 23/3128* (2013.01); *H01L 23/3135* (2013.01); *H01L 23/3142* (2013.01); *H01L 23/3185* (2013.01); *H01L 23/481* (2013.01); *H01L 23/5386* (2013.01); *H01L 24/08* (2013.01); *H01L 2224/08145* (2013.01); *H01L 2924/18301* (2013.01)

(58) Field of Classification Search
CPC ....... H01L 21/78; H01L 21/782; H01L 21/82; H01L 21/8221; H01L 21/56; H01L 21/3043; H01L 23/3043; H01L 23/3142

See application file for complete search history.

(56) References Cited

U.S. PATENT DOCUMENTS

| | | | |
|---|---|---|---|
| 8,293,578 | B2 | 10/2012 | Bartley et al. |
| 8,373,261 | B2 | 2/2013 | Kim et al. |
| 9,768,145 | B2 | 9/2017 | Yu et al. |

(Continued)

FOREIGN PATENT DOCUMENTS

KR  10-2017-0046557 A  5/2017

*Primary Examiner* — David A Zarneke
(74) *Attorney, Agent, or Firm* — Muir Patent Law, PLLC

(57) ABSTRACT

A die stack structure may include a base die having base contact pads insulated by a base protection patterns and a flat side surface, a die stack bonded to the base die and having a plurality of component dies on the base die such that each of the component dies includes component contact pads insulated by a corresponding component protection pattern, and a residual mold unevenly arranged on a side surface of the die stack such that the component dies are attached to each other by the residual mold.

20 Claims, 15 Drawing Sheets

(56) References Cited

U.S. PATENT DOCUMENTS

| | | |
|---|---|---|
| 10,026,704 B2 | 7/2018 | Wu et al. |
| 10,026,716 B2 | 7/2018 | Yu et al. |
| 10,115,579 B2 * | 10/2018 | Fan .................... H01L 24/10 |
| 10,163,859 B2 | 12/2018 | Yu et al. |
| 2009/0085231 A1* | 4/2009 | Chiu .................. H01L 21/56 |
| | | 257/787 |
| 2015/0228632 A1* | 8/2015 | Yu ..................... H01L 21/768 |
| | | 257/704 |
| 2017/0125376 A1 | 5/2017 | Yeh et al. |
| 2017/0133359 A1 | 5/2017 | Mei et al. |
| 2020/0105660 A1* | 4/2020 | Sio ................ H01L 21/823475 |
| 2020/0135605 A1* | 4/2020 | Yu ..................... H01L 25/0657 |
| 2020/0144120 A1* | 5/2020 | Suzuki ............... H01L 21/3043 |
| 2020/0251456 A1* | 8/2020 | Chen ..................... H01L 24/96 |

* cited by examiner

DIE STACK STRUCTURE, SEMICONDUCTOR PACKAGE HAVING THE SAME AND METHOD OF MANUFACTURING THE SAME

CROSS-REFERENCE TO RELATED APPLICATIONS

This application claims priority under 35 U.S.C. § 119 to Korean Patent Application No. 10-2018-0131220 filed on Oct. 30, 2018 in the Korean Intellectual Property Office, the disclosure of which is incorporated by reference herein in its entirety.

BACKGROUND

1. Field

Example embodiments relate to a die stack structure, a semiconductor package having the same and a method of manufacturing the die stack structure and the semiconductor package, and more particularly, to a die stack structure having a plurality of hybrid bonded dies, a semiconductor package having the die stack structure and a method of manufacturing the die stack structure and the semiconductor package.

2. Description of the Related Art

A die (chip) stack structure has been widely used for increasing the performance and the storage capacity of semiconductor devices. In general, the die stack structure is manufactured by one of a die to die bonding process, wafer to wafer bonding process and a wafer to die bonding process.

For example, a stack of a plurality of same-sized dies is stacked on a wafer to increase the storage capacity of the semiconductor package. The plurality of the same-sized dies may be stacked on the wafer in a medium of a gap-fill mold, thereby forming a die column on the wafer. A plurality of die columns may thus be arranged on the wafer and thus a plurality of the same-sized dies is provided as a die stack structure.

In manufacturing the die stack structure, the gap fill mold tends to be extruded from spaces between neighboring dies of a die stack and to make contact with a neighboring die stack. Thus, the each die of the die column is required being spaced apart from the neighboring dies of a die stack by a sufficient gap distance for preventing contact with the extruded gap fill mold. However, the greater the gap distance between the neighboring same-sized dies, the smaller the production yield of die stack structures. For that reason, various researches have been conducted to reduce the gap distance between the neighboring dies and to reduce the distance of dies from the scribe lane of the wafer in the wafer to die bonding process.

In addition, according to the conventional wafer to die bonding process, the chips formed from the wafer as well as the die stack structure on each of such chips are separated by a single dicing or sawing process. The conventional sawing process is suitable for separating a plurality of the die stacks that is secured to the wafer by a mold resin. However, since the wafer comprises semiconductor materials such as silicon (Si) that is completely different from the mold resin, the mechanical sawing process suitable for cutting the mold resin may not be optimal for cutting the wafer comprising the semiconductor materials and various cutting defects may result.

SUMMARY

Example embodiments of the present inventive concept provide a die stack structure having a base die separated from a wafer by an optical sawing process and a die stack separated by a mechanical sawing process Other example embodiments of the present inventive concept provide a semiconductor package having the above die stack structure.

Other example embodiments of the present inventive concept provide a method of forming the die stack structure.

According to exemplary embodiments of the inventive concept, there is provided a die stack structure including a base die having at least a base contact pad insulated by a base protection pattern and a flat side surface, a die stack directly bonded to the base die and having a plurality of component dies on the base die such that each of the component dies may include at least a component contact pad insulated by a component protection pattern, and a residual mold unevenly arranged on a side surface of the die stack.

According to exemplary embodiments of the inventive concept, there is provided a semiconductor package including a circuit board having an electronic circuit pattern, a die stack structure having a plurality of semiconductor dies and arranged on the circuit board such that the die stack structure may be connected to the electronic circuit pattern, and a package mold securing the die stack structure to the circuit board. The die stack structure may include a base die connected to the electronic circuit pattern and having at least a base contact pad insulated by a base protection pattern and a flat side surface, a die stack directly bonded to the base die and having a plurality of component dies on the base die such that the component die may include at least a component contact pad insulated by a component protection pattern, and a residual mold unevenly arranged on a side surface of the die stack.

According to exemplary embodiments of the inventive concept, there is provided a method of forming the above die stack structure.

According to exemplary embodiments of the inventive concept, the base die 10 and the die stack 50 may be directly bonded into the hybrid bonding structure HB without any gap fill molds, nor any bonding adhesives and bonding structures between the die stack 50 and the base die 10, so that no vertical spacing need be provided between the base die 10 and the die stack 50. In the same way, each component dies 20, 30 and 40 of the die stack 50 may be bonded into the hybrid bonding structure HB without any gap fill molds, nor any bonding adhesives and bonding structures between the component die, so that no vertical spacing is provided between neighboring ones of the component dies 20, 30 and 40. Thus the gap fill defects of the die stack structure 90 may be removed or minimized due to the hybrid bonding structure, thereby increasing the reliability and stability of the semiconductor package 500 having the die stack structure 90.

In addition, since no vertical spacing is provided with the die stack structure 90, the height of the die stack structure 90 may be reduced as much as the size of the absent vertical spacing(s). Thus, the form factor of the die stack structure 90 may be improved due to the hybrid bonding structure.

Particularly, the die stack 50 may be separated by the mechanical sawing process and the chip C may be separated by an optical sawing process. The cracks of the reforming spots may grow in the crack direction and the wafer W may be split in the crack direction. Thus, the side surface S of the base die 10 may be formed to be flat and uniform, while the side surface SS of the die stack 50 may be covered by the uneven residual mold 60. Thus, the die stack structure 90 may have different surface roughnesses between a lower side portion (e.g., comprising the smooth side surface S of the base die 10) and an upper side portion (e.g., comprising the rougher uneven residual mold 60 on the side surface SS of the die stack 50). The roughness of the residual mold 60 may be controlled in view of the adhesive strength of the die stack structure 90 to the circuit board.

Further, the wafer W may be loaded into a die stack apparatus (not shown) and the additional die may be individually stacked on each undiced chip C of the wafer W, thereby conducting the die stack process on the wafer W without any additional wafer carriers or the wafer support systems.

BRIEF DESCRIPTION OF THE DRAWINGS

These and other features of the inventive concept will become more apparent by describing in detail exemplary embodiments thereof with reference to the accompanying drawings of which:

FIGS. 7A to 7I are cross sectional views illustrating processing steps for a method of forming the die stack structure shown in FIG. 6 in accordance with an example embodiment of the present inventive concept.

DETAILED DESCRIPTION OF THE EMBODIMENTS

Figure 1:
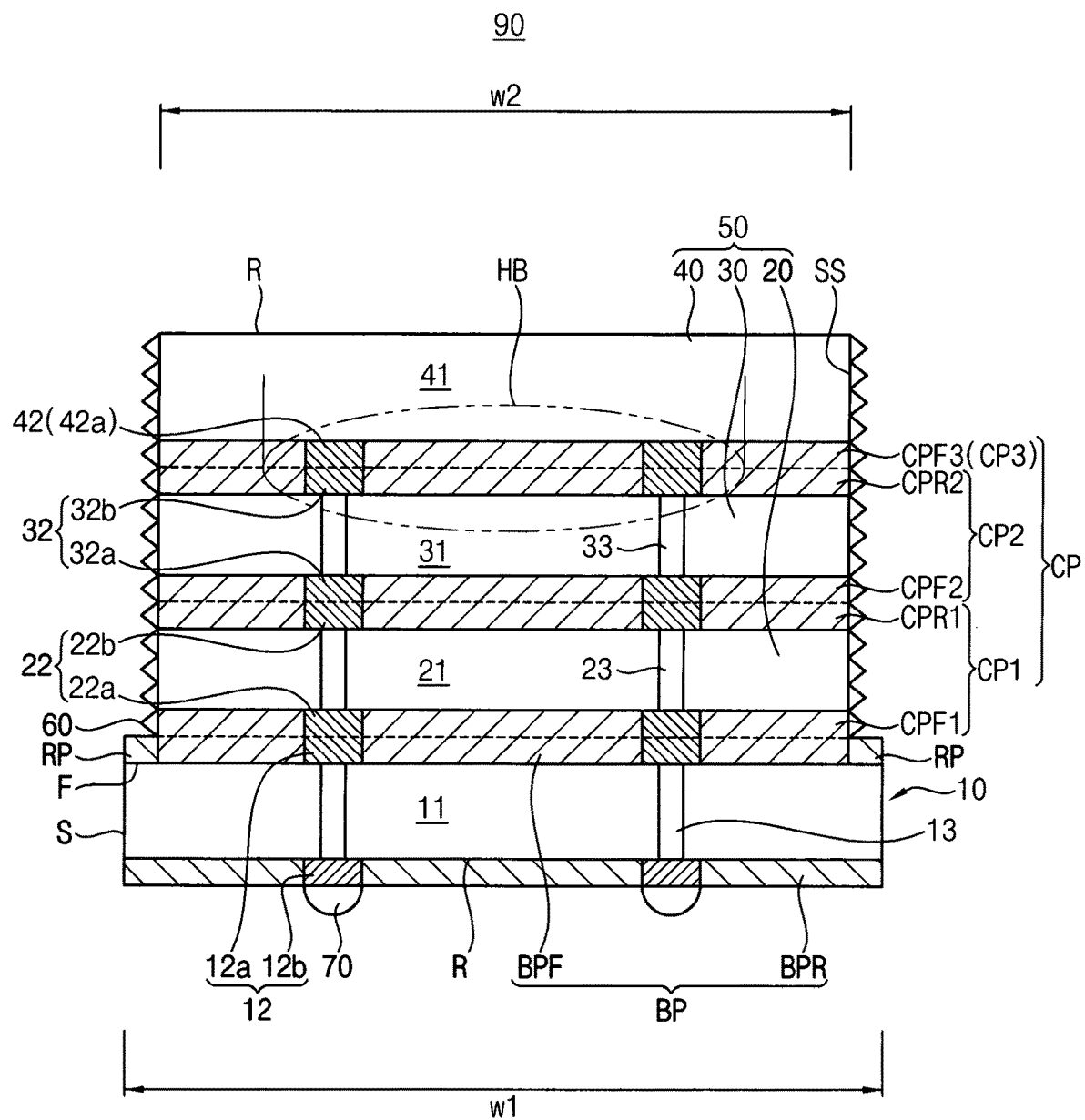
FIG. 1 is a cross sectional view illustrating a die stack structure in accordance with an example embodiment of the present inventive concept.

Reference will now be made to example embodiments, which are illustrated in the accompanying drawings, wherein like reference numerals may refer to like components throughout.

FIG. 1 is a cross sectional view illustrating a die stack structure in accordance with an example embodiment of the present inventive concept.

Referring to FIG. 1, a die stack structure 90 in accordance with an example embodiment of the present inventive concept may include a base die 10 having base contact pads 12 insulated by base protection patterns BP and a flat side surface S, a die stack 50 connected to the base die 10 having a plurality of component dies 20, 30 and 40 on the base die 10. Each of the component dies 20, 30 and 40 may include one or more component contact pads 22, 32 and 42 insulated from each other by component protection patterns CP in which they are formed. A residual mold 60 may be unevenly arranged on a side surface SS of the die stack 50. The component dies of the die stack 50 may be combined to and attached to each other by the residual mold 60.

In the present example embodiment, the die stack structure 90 may include the single base die 10 as the lowermost die and the die stack 50 on the base die 10. The die stack 50 may include first to third component dies 20, 30 and 40 that may be sequentially stacked on the base die 10. While the present example embodiment discloses that three component dies are stacked on the base die 10, two or more than three component dies may also stacked on the base die 10 according to the characteristics and requirements of the die stack structure 90.

The base die 10 and each component die 20, 30 and 40 may each include an integrated circuit (IC) chip manufactured by conventional semiconductor manufacturing processes. Thus, each of the base die 10 and the component dies 20, 30 and 40 may include a plurality of transistors (not shown), wiring structures (not shown) in a corresponding body 11, 21, 31 and 41 of each die and a plurality of contact pads on the body 11, 21, 31 and 41. For example, each body 11, 21, 31 and 41 may include a crystalline semiconductor substrate such as a silicon wafer and a plurality of patterned layers formed thereon (such as patterned insulator layers, patterned conductive layers (of metal or doped semiconductor material, such as doped polysilicon) and/or other semiconductor patterns).

The base die 10 may include a base body 11 in which a plurality of transistor structures and base wiring structures may be arranged and contact pads 12 arranged on the base body 11 and connected to the base wiring structures. The base body 11 includes a front surface F on which the semiconductor manufacturing processes may be conducted and a rear surface R opposite to the front surface F. A front surface F of a die described herein refers to an active surface of the die, corresponding to the surface on which various patterned layers are sequentially formed on a semiconductor substrate of the die (i.e., to form the integrated circuit of the die) during manufacturing the die. A rear surface R of a die described herein refers to the surface of the semiconductor die opposite to the front surface F of the die, which may be a surface of the semiconductor substrate opposite to that on which the plurality of patterned layers are formed. The base contact pads 12 include front base contact pads 12a and a rear base contact pads 12b. In the figures of the present application, only two front base contact pads 12a and two rear base contact pads 12b are shown on the base body 11 for ease of explanation. However, it will be understood that many more base contact pads 12 may also be formed on the base body 11.

The base contact pads 12 may be separated from each other by the base protection pattern BP covering the base body 11 so the base contact pads 12 may be electrically insulated from each other by the base protection pattern BP. The front base contact pads 12a may be separated from each other by a front base protection pattern BPF covering the front surface F of the base body 11 and the rear base contact pads 12b may be separated from each other by a rear base protection pattern BPR covering the rear surface R of the base body 11.

For example, the front base protection pattern BPF may include a passivation layer that is formed to cover the front surface F of the base body 11 by semiconductor manufacturing processes and the rear protection pattern BPR may include an insulation layer that is formed to cover the rear surface R of the base body 11 by a layer formation process for separating bump structures.

The front base contact pads 12a may be positioned on the front surface F of the base body 11 in various arrangements according to the configurations and requirements of the base die 10. For example, the front base contact pads 12a may be arranged into a center pad type in which the front base contact pads 12a may be arranged in a central area of the front surface F of the base body 11 or into an edge pad type in which the front base contact pads 12a may be arranged in an edge area of the front surface F of the base body 11. The front base contact pads 12a may be conventional chip pads of a semiconductor chip (i.e., chip pads of base die 10). The rear base contact pads 12b may be positioned on the rear surface R of the base body 11 in various arrangements according to the process requirements of the packaging process and rear wiring structures (such as a re-directional wiring of a redistribution layer).

The base contact pads 12 may comprise a low resistive conductive material for the efficiency of the signal transfer and the base protection pattern BP may comprise an insulation material for efficiently insulating the base contact pads 12. For example, examples of the low resistive conductive material may include copper (Cu), aluminum (Al), lead (Pb), and combinations thereof. The base protection pattern BP may include any one of silicon oxide, silicon nitride, silicon oxynitride and combinations thereof.

The front surface F and the rear surface R of the base die 10 may be electrically connected to each other by a base penetration electrode 13 penetrating through the base body 11. The base penetration electrode 13 may be provided as various configurations according to interconnection structures of the base die 10 and the front contact pads 12a and the rear base contact pads 12b may be electrically connected by the base penetration electrode 13. The base penetration electrodes 13 may be through substrate vias (TSVs) that extend through the substrate of the base body 11 and/or extend entirely through the base body 11 (as shown). TSVs described herein may be through silicon vias in the instance that the substrate of the base body 11 is silicon. Unless context or an explicit description indicates otherwise, TSVs described herein refer to conductive vias that penetrate through (e.g., from one surface to the other) of at least a substrate of a semiconductor die (or semiconductor device corresponding to a semiconductor chip—such as such a device prior to being separated from a wafer), wherein in some instances, such a TSV may be a conductive via that extends fully through a semiconductor device (e.g., semiconductor die).

For example, a front end portion of the penetration electrode 13 may contact a corresponding one of the front base contact pads 12a at the front surface F of the base body 11 and a rear end portion of the penetration electrode 13 may contact a corresponding one of the rear base contact pads 12b at the rear surface R of the base body 11. Thus, signals may be transferred between the front base contact pads 12a and the rear base contact pads 12b through the base penetration electrode 13.

In the present example embodiment, the base die 10 may be an individual semiconductor chip that is formed by sawing a wafer using an optical sawing process (e.g., using a laser) on which a plurality of the chips are arranged, such as described in detail hereinafter. Thus, the side surface S of the base die 10 may have a relatively flat and smooth surface as compared to dies formed by a mechanical sawing process.

Particularly, a residual base protection pattern RP may be arranged on an edge portion of the base die 10 and thus the edge portion of the base die 10 may be covered by the residual base protection pattern RP and the die stack 50 may be contact with the residual base protection pattern RP. The residual base protection pattern RP may be a portion of the front base protection pattern BPF that may be positioned on a scribe lane SL of the wafer W, which will be described in detail hereinafter.

The die stack 50 may be arranged on the front surface S of the base body 11 and connected to the base die 10. In this example, the die stack 50 includes the first component die 20 in contact with the base die 10 on the front surface S of the base die 10, the second die 30 in contact with the first die 20 on the first die 20 and the third die 40 in contact with the second die 30 on the second die 30.

In some examples, all of the component dies of the die stack 50 except for the uppermost component die (the third component die 40 in the present example) may have structure identical to that provided with the base die 10. In this example, the first and the second component dies 20 and 30 may have structures identical to that of the base die 10.

The first component die 20 may include a first component body 21 in which a plurality of transistor structures and first wiring structures are provided and first component contact pads 22 arranged on the first component body 21 and connected to the first wiring structures. The first component contact pads 22 may include first front component contact pads 22a arranged on a front surface of the first component body 21 and first rear component contact pads 22b arranged on a rear surface of the first component body 21. Additional contact pads 22 may also be arranged on the first component body 21. The first component contact pads 22 may be separated from each other by the first component protection pattern CP1 covering the first component body 21 so that the neighboring first component contact pads 22 may be electrically insulated from each other by the first component protection pattern CP1. The first front component contact pads 22a may be separated from each other by a first front component protection pattern CPF1 covering the front surface of the first component body 21 and the first rear component contact pads 22b may be separated from each other by a first rear component protection pattern CPR1 covering the rear surface of the first component body 21. The first front component contact pads 22a and the first rear component contact pads 22b may have the same arrangement as the front base contact pads 12a. In some examples, the first component contact pads 22 and the first component protection pattern CP may have substantially identical structures as the base contact pad 12 and the base protection pattern BP.

The front and the rear surfaces of the first component die 20 may be electrically connected to each other by first component penetration electrodes 23 penetrating through the first component body 21. The first component penetration electrodes 23 may be TSVs that penetrate the semiconductor substrate of the first component body 21 and/or the entirety of the first component body 21. The first component penetration electrode 23 may have various configurations according to interconnection structures of the first component die 20 and the first front component contact pads 22a and the first rear component contact pads 22b may be electrically connected by the first component penetration electrodes 23. Thus, the signals may be transferred between the first front component contact pads 22a and the first rear component contact pads 22b through the first component penetration electrode 23.

The first component die 20 may be bonded to the base die 10 in a flip chip structure, and thus the front surface of the first component die 20 may face the front surface F of the base die 10 (e.g., in a face down configuration). In such a case, the first front component contact pads 22a may be directly bonded to corresponding ones of the front base contact pads 12a and gap fill molds and/or any bonding adhesives therebetween may not be needed. That is, the first front component contact pad 22a and the front base contact pad 12a may be directly bonded to each other to contact each other without use of any intermediate structure as a first bonded contact 26. In the same way, a first front component protection pattern CPF1 of the first component die 20 may be contact the front base protection pattern BPF of the base die 10 without any gap fill molds and/or any bonding adhesives therebetween as a first bonded pattern 27. The first front component protection pattern CPF1 and the front base protection pattern BPF may be bonded or adhered to each other by a contact method without use of any intermediate structures. The direct bonding between the first front component contact pad 22a and the front base contact pad 12a and the direct bonding between the first front component protection pattern CPF1 and the front base protection pattern BPF may be simultaneously conducted in the same thermal compression bonding process.

In the present example embodiment, the first component contact pad 22 and the base contact pad 12 may comprise copper (Cu) and the first component protection pattern CP1 and the base protection pattern BP may comprise silicon oxide. Thus, the first front component contact pad 22a and the front base contact pad 12a may be conductively and directly bonded to each other without any intermediate structures. In the same way, the first front component protection pattern CPF1 and the front base protection pattern BPF may be insulatively and directly bonded to each other without any intermediate structures. That is, the first component die 20 and the base die 10 may be directly bonded to each other in a conductive-insulative hybrid bonding structure of the first bonded contact 26 and the first bonded pattern 27.

The second component die 30 may have an identical structure to that of the first component die 20. Thus, the second component die 30 may include a second component body 31 in which a plurality of transistor structures and second wiring structures are formed and second component contact pads 32 formed on the second component body 31 and connected to the second wiring structures. The second component contact pads 32 include second front component contact pads 32a arranged on a front surface of the second component body 31 and second rear component contact pads 32b arranged on a rear surface of the second component body 31. The second component contact pads 32 may be separated from each other by the second component protection pattern CP2 covering the second component body 31, so the neighboring second component contact pads 32 may be electrically insulated from each other by the second component protection pattern CP2. The second front component contact pads 32a may be separated from each other by a second front component protection pattern CPF2 covering the front surface of the second component body 21 and the second rear component contact pads 32b may be separated from each other by a second rear component protection pattern CPR2 covering the rear surface of the second component body 31. The second component contact pad 32 and the second component protection pattern CP2 may be formed of copper (Cu) and silicon oxide, respectively, just like the first component contact pad 22 and the first component protection pattern CP1.

The front and the rear surfaces of the second component die 30 may be electrically connected to each other by a second component penetration electrodes 33 (e.g., TSVs) penetrating through the second component body 31. Thus, the second front component contact pads 32a and the second rear component contact pads 32b may be connected by corresponding ones of the second component penetration electrodes 33. The Signals may be transferred between the second front component contact pads 32a and the second rear component contact pads 32b through the second component penetration electrodes 33 in the second component die 30.

The second component die 30 may be connected to the first component die with a flip chip structure (e.g., with the front surface in a face down configuration). The second front component contact pads 32a may be directly bonded to the first rear component contact pads 22b without any gap fill molds and/or any bonding adhesives therebetween. In addition, a second front component protection pattern CPF2 of the second component die 30 may be directly bonded to the first rear protection pattern CPR1 of the first component die 20 without any gap fill molds and/or any bonding adhesives therebetween. The direct bonding between the second front component contact pad 32a and the first rear component contact pad 22b and the direct bonding between the second front component protection pattern CPF2 and the first rear component protection pattern CPR1 may be simultaneously conducted in the same thermal compression bonding process. In the present example embodiment, the second component contact pad 32 and the first component contact pad 22 may be and/or comprise copper (Cu) and the second component protection pattern CP2 and the first component protection pattern CP1 may be formed of silicon oxide. Thus, the second front component contact pads 32a and the first rear component contact pads 22b may electrically directly connect with each other (i.e., without any intermediate structures). In the same way, the second front component protection pattern CPF2 and the first rear component protection pattern CPR1 may contact each other without any intermediate structures. That is, the second component die 30 and the first component die 20 may also be bonded to each other in the conductive-insulative hybrid bonding structure.

The third component die 40 may be provided as the uppermost die of the die stack structure 90, so that a third rear component contact pad and a third rear component protection pattern may not be provided with the third component die 40. In addition, no penetration electrodes may be provided with the third component die 40. Besides the above mentioned differences, the third component die 40 may have identical structure to that of the first and the second component dies 20 and 30.

Thus, the third component die 40 may include a third component body 41 in which a plurality of transistor structures and third wiring structures are formed and third component contact pads 42 formed on the third component body 41 and connected to the third wiring structures. The third component contact pads 42 may include third front component contact pads 42a arranged on a front surface of the third component body 41. The third component contact pads 42 may be separated from each other by the third component protection pattern CP3 covering the third component body 41, so that the third component contact pads 42 may be electrically insulated from each other by the third component protection pattern CP3. The third front component contact pads 42a may be separated from each other by a third front component protection pattern CPF3 covering the front surface of the third component body 41. Since the third rear component contact pads may not provided with the third component body 41, a third rear component protection pattern may not be provided with the third component body 41 and the third component protection pattern CP3 may only include the third front component protection pattern CPF3.

The third component contact pad 42 and the third component protection pattern CP3 may be formed of copper (Cu) and silicon oxide, respectively, just like the first component contact pad 22 and the first component protection pattern CP1 and the second component contact pad 32 and the second component protection pattern CP2.

The third front component contact pad 42a may be directly bonded to the second rear component contact pad 32b without any gap fill molds and/or any bonding adhesives therebetween. In addition, a third front component protection pattern CPF3 of the third component die 40 may be directly bonded to the second rear protection pattern CPR2 of the second component die 30 without any gap fill molds and/or any bonding adhesives therebetween. The direct bonding between the third front component contact pad 42a and the second rear component contact pad 32b and the direct bonding between the third front component protection pattern CPF3 and the second rear component protection pattern CPR2 may be simultaneously conducted in the same thermal compression bonding process. In the present example embodiment, the third component contact pad 42 and the second component contact pad 32 may include copper (Cu) and the third component protection pattern CP3 and the second component protection pattern CP2 may include silicon oxide. Thus, the third front component contact pad 42a and the second rear component contact pad 32b may be conductively and directly bonded to each other without any intermediate structures. In the same way, the third front component protection pattern CPF3 and the second rear protection pattern CPR2 may be insulatively and directly bonded to each other without any intermediate structures. That is, the third component die 30 and the second component die 30 may also be bonded to each other in the conductive-insulative hybrid bonding structure.

An uppermost rear surface UR of the third component die 40 may be a flat surface due to a thinning process to a rear portion (e.g., to a backside) of the third die 40. The thinning process to the rear portion of the third die 40 will be described in detail hereinafter.

The first, the second and the third dies 20, 30 and 40 may have substantially the same widths W2, which is hereinafter referred to as stack width, and may be stacked on the base die 10 with a single common central axis. The side surfaces SS of the die stack 50 may vertically extend upwards.

In addition, as described in detail hereinafter, since the scribe lane SL may be split in a crack direction from a local reforming spot 17 along a split face at a central portion thereof, an edge portion of the base die 10 may include a portion of the substrate of the wafer W corresponding to the scribe lane (e.g., a portion under the scribe lane). Thus, a width W1 of the base die 10, which is hereinafter referred to as base width, may be greater than the stack width W2 and the edge portion of the base die 10 may extend past the side surface SS of the die stack 50.

For example, the residual mold 60 may be arranged on the edge portion of the base die 10 and the side surface SS of the die stack 500 and the die stack 50 may be secured to the base die 10 by the residual mold 60. Particularly, the residual mold 60 may be unevenly arranged on the side surface SS of the die stack 50.

The residual mold 60 may be residuals of a mechanical sawing process applied to a wafer level mold (not shown) covering the die stack 50, so that the configurations of the residual mold 60 may be changed according to the process conditions and characteristics of the mechanical sawing process. For example, the residual mold 60 may be shaped into a bulgy and hollow shape due to the mechanical sawing process.

In the present example embodiment, the wafer level mold may be split by a blade sawing process, so that the residual mold 60 may be shaped into a bulgy and hollow shape according to the shape of the cutting blade. The bulgy and hollow shapes and structures described herein may comprise a plurality of protrusions and depressions. Therefore, the configurations of the residual mold 60 may vary according to the sawing process and the shape of the cutting tool.

Figure 2:
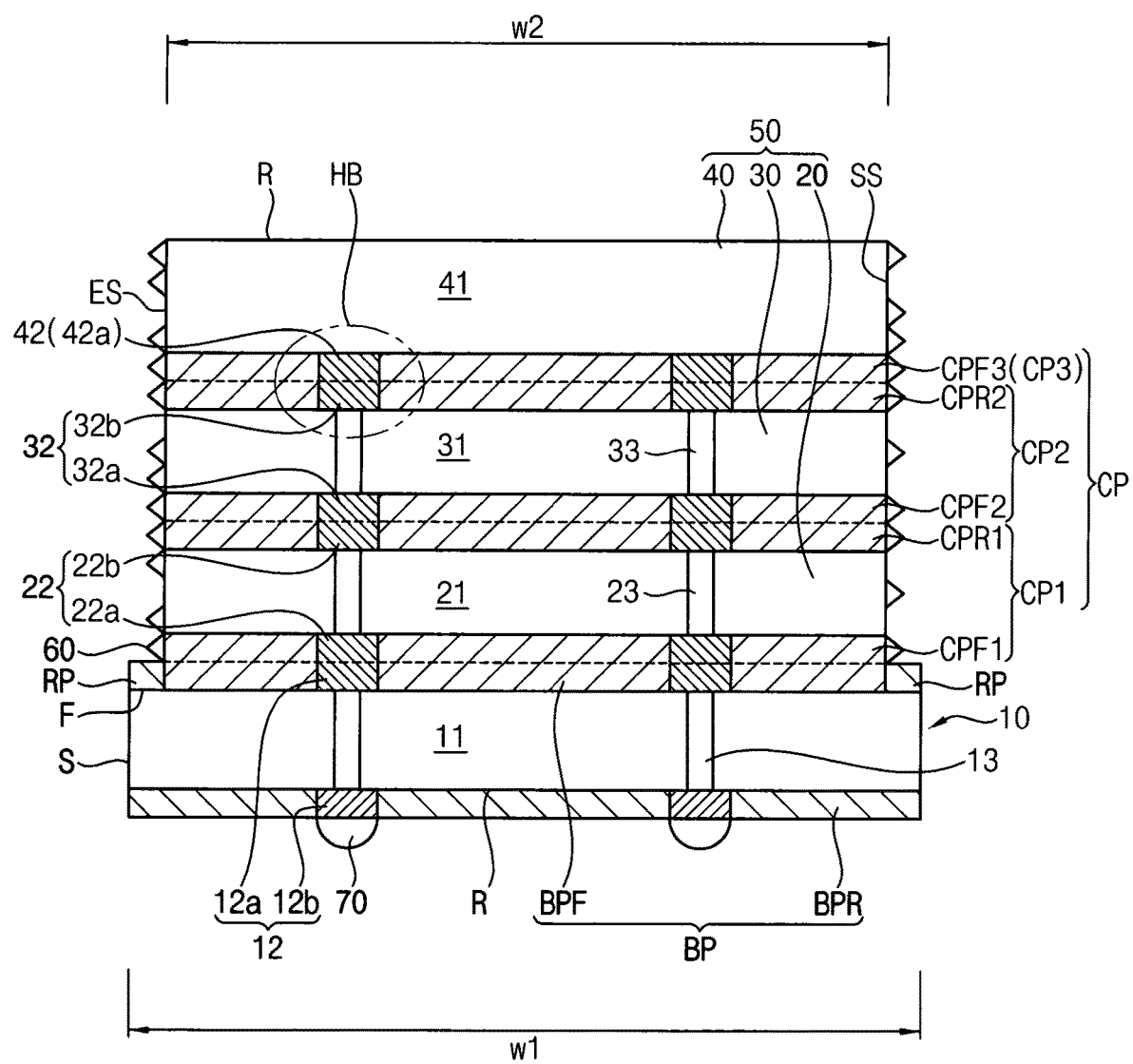
FIG. 2 is a cross sectional view illustrating a modified die stack structure in accordance with another example embodiment of the present inventive concept.

FIG. 2 is a cross sectional view illustrating a modified die stack structure in accordance with another example embodiment of the present inventive concept.

Referring to FIG. 2, the modified die stack structure 91 may include the exposed surface ES at the side surface SS of the die stack 50. The residual mold 60 may be continuous or discontinuous along the side surface SS of the die stack 50 according to the characteristics of the sawing process and material properties of the wafer level mold. When the residual mold 60 is continuous on the side surface SS of the die stack 50, the whole surface of the side surface SS of the die stack 50 may be fully covered by the residual mold 60. In contrast, when the residual mold 60 is discontinuous on the side surface SS of the die stack 50, the side surface SS of the die stack 50 may be partially exposed through the residual mold 60, thereby forming an exposed surface ES.

When the side surface SS of the die stack 50 is partially exposed through the residual mold 60, the package mold of a semiconductor package having the die stack structure 90 may contact the exposed surface ES of the die stack 50 as well as the residual mold 60. Thus, the contact area of the package mold may be enlarged to the exposed surface ES as well as the residual mold 60, thereby improving adherence characteristics of the package mold to the die stack structure 90 in the semiconductor package. For that reason, the size of the exposed surface ES may be controlled in consideration of the adherence characteristics of the package mold. In addition, the heat of the semiconductor package may be dissipated through the package mold in contact with the exposed surface ES of the die stack structure 90, which may improve the heat dissipation of the semiconductor package including the die stack structure 90.

Particularly, since the base die 10 may be formed by the substrate split in the crack direction from the local reforming spot, the cutting face of the substrate in the scribe lane may be formed to be flat and smooth. Thus, the side surface S of the base die 10 may be flat and smooth, while the side surface SS of the die stack 50 may be covered by the uneven residual mold 60. Therefore, the side surface of an upper portion of the die stack structure 90 (comprising residual mold 60 on side surface S of the die stack 50) may have a surface roughness greater than that of the side surface of a lower portion of the die stack structure 90 (comprising side surface S of the base die 10) and the overall surface roughness of the die stack structure 90 may be non-uniform along the height.

Referring to again FIG. 1, contact terminals 70 may be provided on the rear surface R of the base body 11 each of which may contact a corresponding rear base contact pad 12*b*. The die stack structure 90 may communicate with external devices through the contact terminals 70 and the rear base contact pads 12*b*. For example, each contact terminal 70 may include a solder bump on the rear base contact pad 12*b* that may be electrically insulated by the rear base protection pattern BPR.

According to an example of the present inventive die stack structure 90, the base die 10 and the die stack 50 may be directly bonded to each other into a conductive-insulative hybrid bonding structure HB without any gap fill molds and/or any bonding adhesives therebetween. Thus, the height of the die stack structure 90 may be reduced (e.g., as much as the height of the thicknesses of the gap fill mold and/or the boding adhesives which may have otherwise been used), thereby reducing the form factor of the die stack structure 90.

Figure 3:
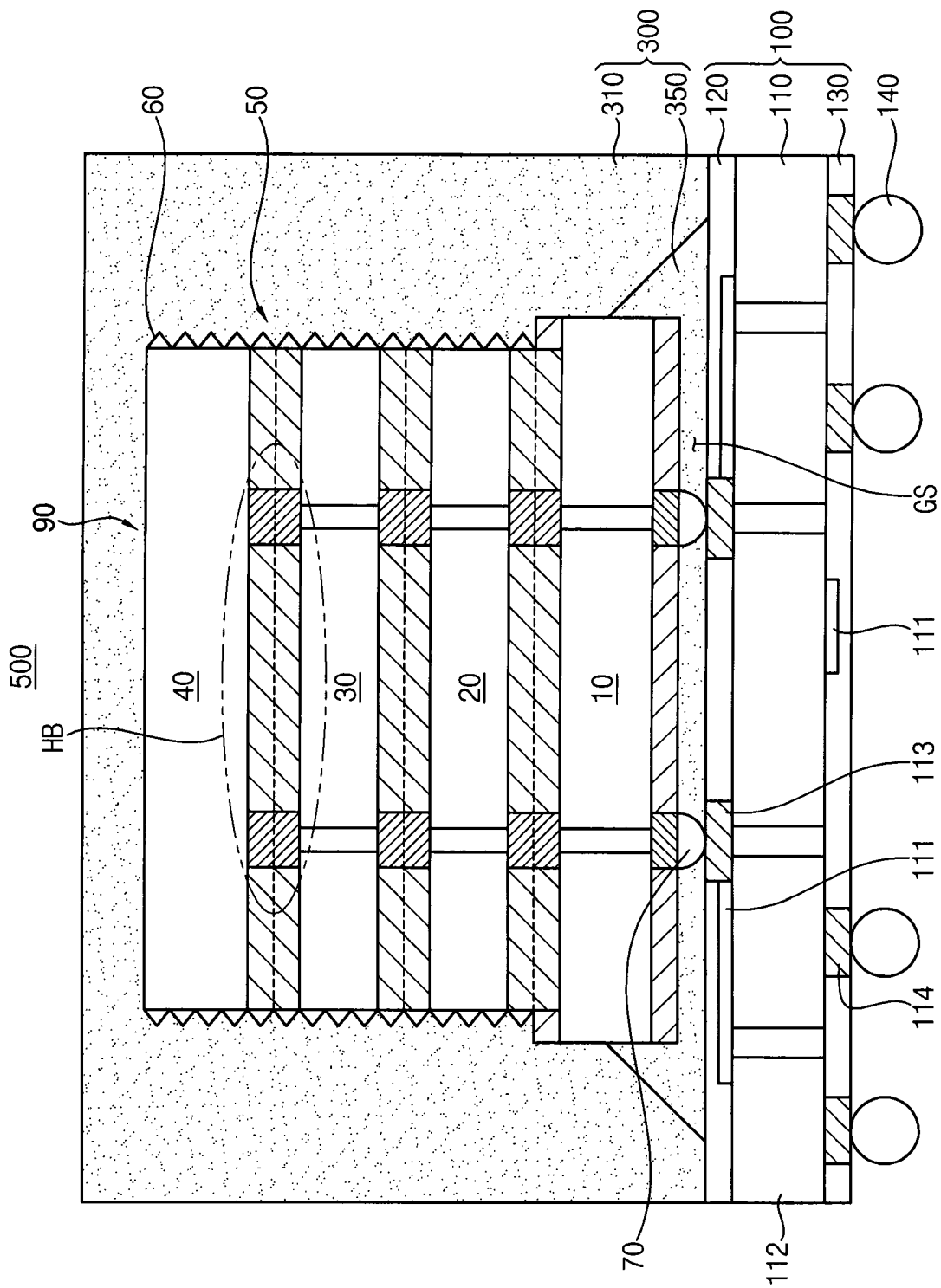
FIG. 3 is a cross sectional view illustrating a semiconductor package having the die stack structure shown in FIG. 1.

FIG. 3 is a cross sectional view illustrating a semiconductor package having the die stack structure shown in FIG. 1.

Referring to FIG. 3, a semiconductor package 500 in accordance with an example embodiment of the present inventive concept and may include a circuit board 100 (e.g., a printed circuit board, or PCB) having an electronic circuit pattern 111, the die stack structure 90 having a plurality of semiconductor dies and arranged on the circuit board 100 such that the die stack structure 90 is connected to the electronic circuit pattern, and a package mold 300 attaching the die stack structure 90 to the circuit board 100.

In such a case, the die stack structure 90 includes a base die 10 connected to the electronic circuit pattern 111 and having base contact pads 12 insulated by a base protection pattern BP and a flat side surface S, a die stack 50 bonded to the base die 10 and having a plurality of component dies 20, 30 and 40 on the base die 10, the component dies including contact pads 22, 32 and 42 insulated by component protection patterns CP1, CP2 and CP3, and a residual mold 60 evenly formed on a top surface of the base die 10 and unevenly formed on a side surface SS of the die stack 50 such that the die stack may be combined to the base die 10 with the residual mold 50. The die stack structure 90 may be the same as described in detail with reference to FIGS. 1 and 2.

For example, the circuit board 100 may include a core body 110 comprising a tempered glass fiber or an epoxy resin and an electrical circuit pattern 111 on an upper surface and a lower surface of the core body 110. The electric circuit pattern may include a data transfer pattern for transferring electric data to/from the die stack structure 90, a driving pattern for transferring operational power to the die stack structure 90 and a ground pattern for electrically grounding the die stack structure 90.

Particularly, an upper insulation layer 120 may be arranged on the upper surface of the core body 110 and the circuit pattern 111 on the upper surface of the core body 110 may be insulated by the upper insulation layer 120. In the same way, the lower insulation layer 130 may be arranged on the lower surface of the core body 110 and the circuit pattern 111 on the lower surface of the core body 110 may be insulated by the lower insulation layer 130. For example, the upper and lower insulation layers 120 and 130 may include a photosensitive resin such as a photo epoxy and a photosensitive polymer such as a photo solder resist.

The circuit pattern 111 may be provided as a single layer structure or a multilayer structure. The circuit pattern 111 may include wirings extending on the upper and the lower surfaces of the core body 110. The separated wirings may be interconnected with each other by a board via structure 112.

Upper board pads 113 may be arranged on the upper surface of the core body 110 and the die stack structure 90 may contact the upper board pads 113. Lower board pads 114 may be arranged on the lower surface of the core body 110 and board terminals 140 may contact the lower board pads 114. At least some of the circuit pattern 111 may extend from the upper board pads 113 and/or the lower board pads 114.

The upper board pads 113 may contact the contact terminals 70 of the die stack structure 90 and with the circuit pattern 111. The upper board pads 113 may be directly connected to the circuit pattern 111 or be indirectly connected to the circuit pattern (e.g., with a re-directional line of a redistribution pattern interposed therebetween). In addition, the data transfer pattern may be provided as a single wiring line for each data bit (e.g., one data line for each of DQ0 to DQ15), while the power pattern and the grounding pattern may be provided as a group of the wiring lines for each voltage that is transmitted to the die stack structure 90. The lower board pads 114 may contact the board terminals 140 to communicate with external devices.

Thus, the upper and the lower board pads 113 and 114 may function as input/output ports (terminals) of board 100 and the die stack structure 90 may communicate external devices via board 100. Thus, board 100 and the die stack structure 90 may constitute a single electronic device or system. The upper and the lower board pads 113 and 114 may include aluminum (Al), copper (Cu) and an alloy thereof (and may also include an alloy of nickel (Ni) and silver (Au) coated on an external surface thereof).

The upper insulation layer 120 may be patterned on the upper surface of the circuit board 100 in such a configuration that the upper board pad 113 is exposed and the circuit pattern 111 is covered by the upper insulation layer 120. In the same way, the lower insulation layer 130 may be patterned on the lower surface of the circuit board 100 in such a configuration that the lower board pad 114 is exposed and the circuit pattern 111 is covered by the lower insulation layer 130.

The die stack structure 90 may be the same structures as that described in detail with reference to FIGS. 1 and 2. Thus, in FIG. 3, the same reference numerals denote the same elements in FIGS. 1 and 2 and the further descriptions on the same elements may be omitted hereinafter.

The die stack structure 90 may be bonded to the circuit board 100 in such a configuration that the contact terminal 70 of the die stack structure 90 contacts the upper board pad 113. Thus, the die stack structure 90 may be mechanically combined to and electrically connected with the circuit board 100 by the contact terminal 70. For example, the contact terminal 70 may be a solder bump, a solder ball and a pillar structure.

The die stack structure 90 may be bonded to the circuit board 100 in such a configuration that the rear surface R (e.g., backside) of the base die 10 may face the upper surface of circuit board 100. Particularly, the die stack 50 may be bonded to the base die 10 into the hybrid bonding structure HB in which the first component die 20 may make contact with the base die 10 across its entire surface. For example, the direct bonding between the first front component contact pad 22*a* and the front base contact pad 12*a* and the direct bonding between the first front component protection pattern CPF1 and the front base protection pattern BPF may be simultaneously conducted in the same thermal compression bonding process, so that the first component die 20 and the base die 10 may be directly bonded by a conductive-insulative hybrid bonding process along a whole front surfaces of the base die 10 and the first component die 20. The first component die 20 and the second component die 30 may also be bonded to each other by the same conductive-insulative hybrid bonding process and the second component die 30 and the third component die 40 may be bonded to each other by the same conductive-insulative hybrid bonding process.

Thus, the base die 10 and each component dies 20, 30 and 40 may be directly bonded to each other without any gap fill molds, nor any bonding adhesives and bonding structures therebetween, thereby removing vertical spacing between the base die 10 and each component dies 20, 30 and 40. As a result, the gap fill defects of the die stack structure 90 may be sufficiently prevented in the semiconductor package 500. In addition, since the height of the die stack structure 90 can be reduced as much as the size of absent vertical spacing(s), the height of the semiconductor package 500 may also be reduced as much as the size of the absent vertical spacing(s), thereby improving the form factor of the semiconductor package 500.

Particularly, although the component dies 20, 30 and 40 of the die stack 50 may have substantially the same width W2, the gap fill defects between the component dies 20, 30 and 40 may not occur in the hybrid bonding process for forming the die stack structure 90, because the vertical spacings need not exist between the base die 10 and the component dies 20, 30 and 40. Therefore, the form factor of the die stack structure 90 may be reduced, manufacturing yield increased and/or the memory capacity of die stack structures 90 may be easily increased (e.g., by increasing the number of memory dies in a die stack structure) due to the stable stack of the dies, and thus the semiconductor package 500 including the die stack structure 90 may increase the memory capacity and operation reliability.

In the present example embodiment, the base die 10 may be a logic device and/or a memory device (e.g., a memory controller semiconductor chip or a memory semiconductor chip) and the dies of the die stack 50 may each be a memory device (i.e., each of dies 20, 30 and 40 may be a semiconductor memory chip). The memory device may be a volatile memory device such as a dynamic random access memory (DRAM) device or a non-volatile memory device such as NAND flash memory device, PRAM, RRAM, MRAM, etc.

Particularly, when the die stack 50 includes memory devices, the memory capacity of the die stack 50 may be simply increased by increasing the number of the component dies of the die stack 50.

When the base die 10 is a logic device and a memory devices are dies of the die stack 50, the number of the component dies of the die stack 50 may be chosen according to the operation characteristics and/or requirements of the logic device. For example, the semiconductor package 500 having the logic device as the base die 10 and the memory devices as the dies of the die stack 50 may form an application processor (AP) as the logic device (embodied by base die 10) having internal memory (formed by dies of the die stack 50) or may form a central process unit (CPU) as the logic device (embodied by base die 10) having an internal cache memory (formed by dies of the die stack 50).

The package mold 300 may mechanically combine the die stack structure 90 to the circuit board 100 and may protect the die stack structure 90 from surroundings.

For example, the package mold 300 may include a sealing member 310 for covering the die stack structure 90 on the circuit board 100 and an under fill mold 350 filling up a gap space GS between the circuit board 100 and the die stack structure 90.

The sealing member 310 may encapsulate and cover the die stack structure 90 in such a configuration that the die stack structure 90 may be sealed and protected from surroundings and may be mechanically combined to the circuit board 100. For example, the sealing member 310 may include an epoxy mold compound (EMC) just like the under fill mold 350. In some examples, the sealing member 310 may not cover the top surface of the die stack structure such that the die stack structure 90 is exposed with respect to the sealing member 310. Top surface of the die stack structure 90 and the sealing member 310 may be co-planar and/or flush with each other. Various heat dissipating structures (such as a heat sink—not shown) may be further provided on the sealing member 310 for dissipating the heat generated from the die stack structure 90.

Particularly, since the base die 10 may have a flat side surface S, the sealing member 310 may conformally cover the side portion of the base die 10. In contrast, since the residual mold 60 may unevenly cover the side surface SS of the die stack 50 and may be have the bulgy and hollow structure, the sealing member 310 may cover non-uniformly the side surface SS of the die stack 50.

That is, the contact area between the sealing member 310 and the residual mold 60 may increase due to the rough surface area of the bulgy and hollow structure of the residual mold 60, so that the adhesive strength of the sealing member to the die stack 50 may be improved due to the bulgy and hollow structure of the residual mold 60.

In a modified example embodiment, the side surface SS of the die stack 50 may be partially exposed for improving the heat dissipation while still increasing the adhesive strength of the die stack structure 90.

Figure 4:
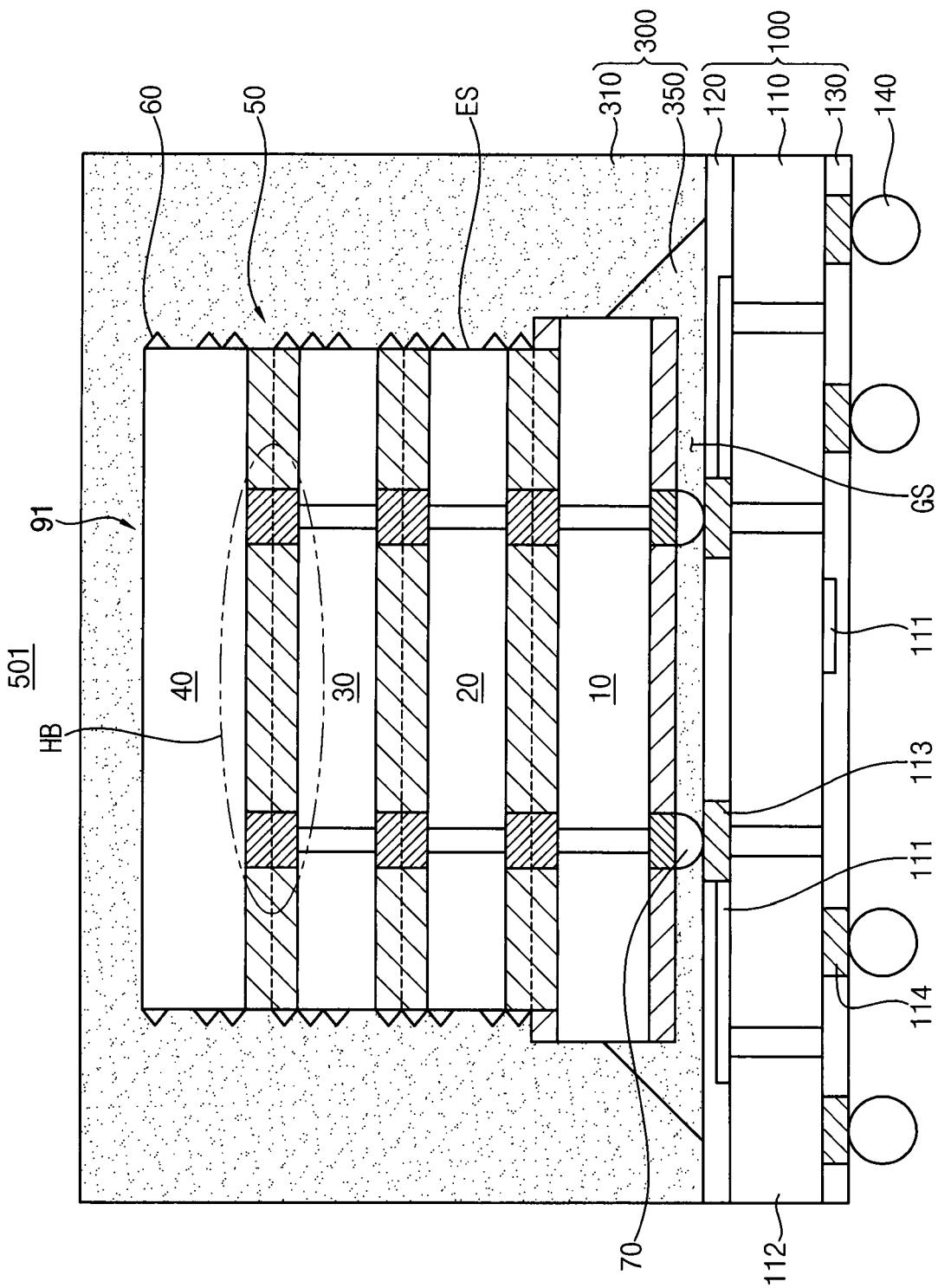
FIG. 4 is a cross sectional view illustrating a modified semiconductor package having the die stack structure shown in FIG. 2.

FIG. 4 is a cross sectional view illustrating a modified semiconductor package having the die stack structure shown in FIG. 2. In FIG. 4, the modified semiconductor package 501 has the same structures as the semiconductor package 500 of FIG. 3, except that the die stack structure 90 is replaced with the modified die stack structure 91 shown in FIG. 2. Thus, in FIG. 4, the same reference numerals denote the same elements in FIG. 3 and any further detailed descriptions on the same elements may be omitted hereinafter.

Referring to FIG. 4, a modified semiconductor package 501 includes the modified die stack structure 91 in which the residual mold 60 is discontinuously formed on the side surface SS of the die stack 50 and the exposed surface ES may be provided with the side surface SS of the die stack 50.

Thus, the side surface SS of the die stack 50 may be covered by the discontinuous residual mold 60 and the sealing member 310. The exposed surface ES of the die stack 50 may contact and may be covered by the sealing member 310 and the rest of the side surface SS of the die stack 50 may be covered by the residual mold 60.

When the heat dissipation structure may be arranged on the sealing member 310, the die stack 50 may be directly contact with sealing member 310 at the exposed surface ES and as a result, the heat generated from each component dies 20, 30 and 40 of the die stack 50 may be efficiently dissipated out from the die stack 50. Particularly, since the function of the residual mold 60 may focus on (e.g., be chosen to optimize and/or increase) the mechanical combination of the component dies in the die stack 50 and to the mechanical combination of the die stack 50 to the base die 10, the heat dissipation ability may be a secondary characteristic of the residual mold 60. However, when the residual mold 60 is discontinuous to provide the exposed surface ES with the side surface of the die stack 50, as long as the residual mold 60 may sufficiently mechanically combine the component dies to each other in the die stack 50 and mechanically combine the die stack 50 to the base die 10, the efficiency of the heat dissipation of the die stack 50 may be improved by the contact with the sealing member 310 and the exposed surface ES of the die stack 50.

In addition, since the die stack 50 may be contact with the sealing member 310 at the exposed surface ES, the adhesive strength between the component dies 20, 30 and 40 and between the die stack 50 and the base die 10 may be sufficiently improved and thus the die stack structure 90 may be stably combined to the circuit board 100. It will be appreciated that the exposed surface ES of the die stack 50 may include side surfaces of the dies 20, 30, 40 and thus the sealing member 310 may contact the sides surface(s) of one or more of dies of the die stack 50 (one or more side surfaces of 20, 30 and 40) to improve heat dissipation from the dies of the dies stack.

The epoxy mold compounds (EMC) may be filled into the gap space GS between the circuit board 100 and the die stack structure 90 by a molded under fill (MUF) process, thereby forming the under fill mold 350 in the gap space GS. When a plurality of the die stack structures 90 are bonded to the single circuit board 100, a plurality of the under fill molds 350 may be simultaneously formed in each gap spaces between the single circuit board 100 and each of the die stack structures 90 by a single MUF process (the plurality of underfill molds 350 simultaneously formed by a single MUF process may be formed as a continuous underfill layer and later separated by a cutting process to separate thus formed packages from each other). Each of the under fill molds 350 may be individually formed in the corresponding gap space GS by an individual under fill process.

According to the method of manufacturing semiconductor packages, the base die 10 and the die stack 50 may be directly bonded into the hybrid bonding structure HB without any gap fill molds, nor any bonding adhesives and bonding structures between adjacent dies, so that no vertical spacing need be interposed between the base die 10 and the die stack 50. In the same way, each component die 20, 30 and 40 of the die stack 50 may be bonded into the hybrid bonding structure HB without any gap fill molds, nor any bonding adhesives and bonding structures therebetween, so that no vertical spacing need be interposed between neighboring ones of the component dies 20, 30 and 40. Thus the gap fill defects of the die stack structure 90 may be removed or minimized due to the hybrid bonding structure, thereby increasing the reliability and stability of the semiconductor package 500 having the die stack structure 90. In addition, since no vertical spacing need be provided with the die stack structure 90, the height of the die stack structure 90 may be reduced as much as the size of the absent vertical spacing(s). Thus, the form factor of the die stack structure 90 may be improved due to the hybrid bonding structure.

Particularly, although the component dies 20, 30 and 40 may have the same width W2, the die stack 50 may be formed without any gap fill defects because the gap fill process may not be needed for forming the die stack 50, thereby increasing the reliability of the semiconductor package 500.

Hereinafter, a method of forming the die stack structure 90 will be described in detail with references to FIGS. 5 to 7I.

Figure 5:
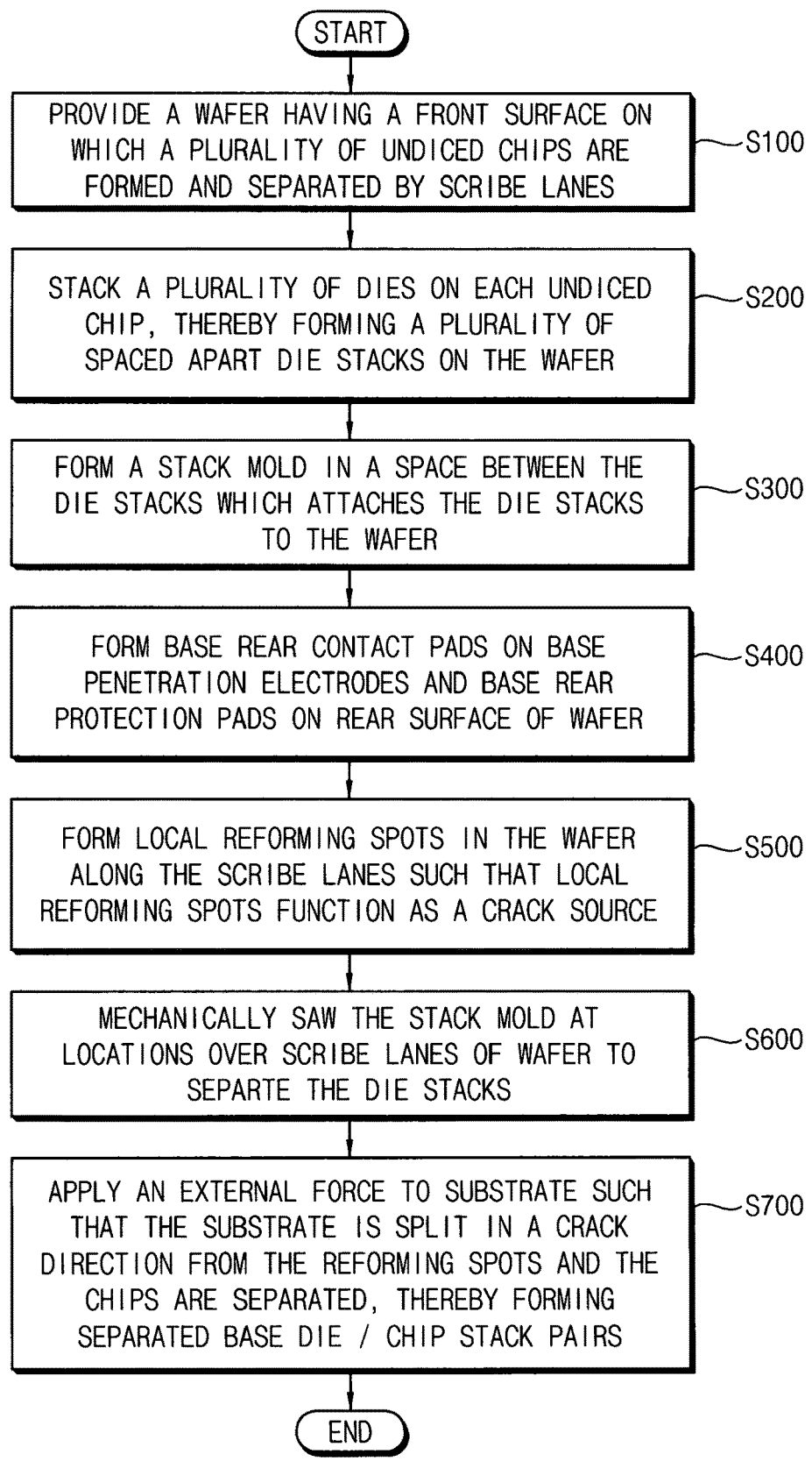
FIG. 5 is a flow chart showing a method of forming the die stack structure shown in FIG. 1 in accordance with an example embodiment of the present inventive concept.
Figure 6:
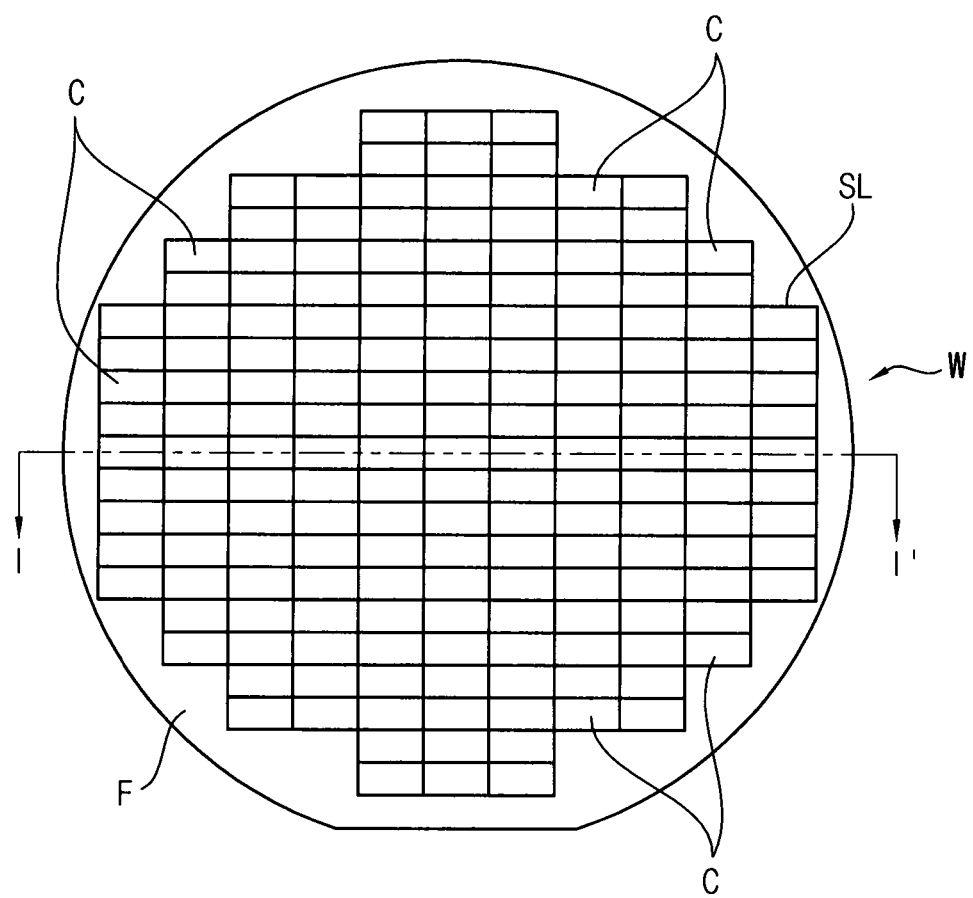
FIG. 6 is a plan view illustrating a wafer having a plurality of chips that is provided as the base die of the die stack structure shown in FIG. 1.

FIG. 5 is a flow chart showing an exemplary method of forming the die stack structure 90 shown in FIG. 1 and the die stack structure 91 shown in FIG. 2 in accordance with example embodiments of the present inventive concept. FIG. 6 is a plan view illustrating an exemplary wafer having a plurality of undiced chips each of which corresponds to the base die of the die stack structure shown in FIG. 1. FIGS. 7A to 7I are cross sectional views illustrating processing steps for a method of forming the die stack structure shown in FIG. and the die stack structure 91 shown in FIG. 2 in accordance with example embodiments of the present inventive concept. FIGS. 7A to 7I are cross sectional views cutting along a line I-I' of FIG. 6. It should be appreciated that reference to "undiced chips" refers to a semiconductor device that that has yet to be separated (e.g., from a wafer) to form a semiconductor chip, and that reference to a "chip" or "semiconductor chip" by itself (i.e., without an "undiced" or other similar modifier) will be understood to refer to a semiconductor device embodied in a portion of a wafer that has been cut from the wafer.

Figure 7A:
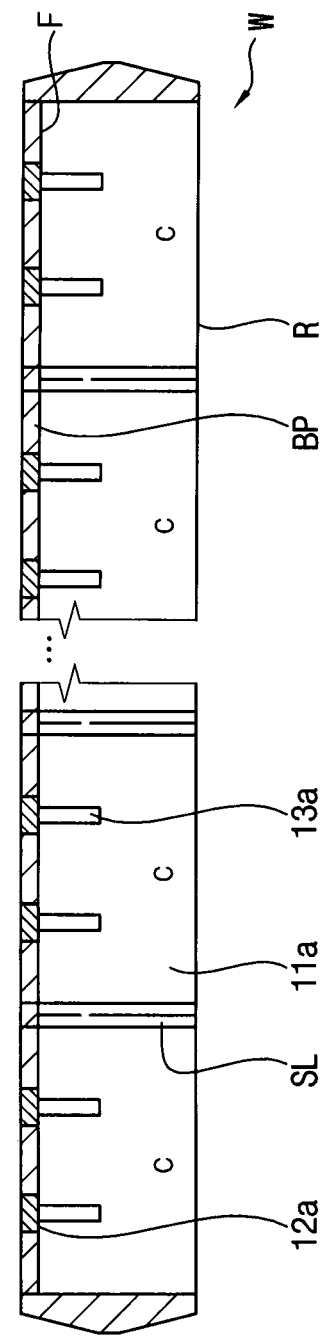

Referring to FIGS. 5 and 7A, a semiconductor wafer W may be provided in such a configuration that a plurality of undiced chips C may be arranged and be separated by a scribe lane SL (step S100). The scribe lanes SL between the undiced chips may comprise areas of the wafer W in which no circuits (e.g., no transistors) are formed and/or no circuits (e.g., no transistors) are formed that are part of the integrated circuits of the undiced chips C. Contact pads, such as chip pads, may be formed on the body of the undiced chip C (step S100).

For example, a series of conventional semiconductor manufacturing processes may be conducted to form wafer W, such as forming a plurality of transistors (not shown) and a plurality of wiring structures (not shown) on a semiconductor crystalline substrate to form body 11a of an undiced chip C. Then, base contact pads 12a may be formed on the body 11a and connected to the internal wiring structures of the chip C. The base contact pads 12a may be insulated from each other by a base protection pattern BP. It will be appreciated that although pads, such as base contact pads 12a, may be described as insulated from each other by a pattern or layer, other wiring may connect the pads together according to the design (e.g., chip pads to receive external power may be connected internally and/or externally to a chip C to provide a more stable power supply to the chip C).

The wafer W may include a front surface F (corresponding to the surface on which the semiconductor manufacturing processes had been conducted (e.g., corresponding to the active surfaces of the undiced chips C) and a rear surface R opposite to the front surface F. The base protection pattern BP may be a patterned passivation layer on the upper surface of the body 11a that prevents upper portions of the wiring structure of body 11a from exposure. The passivation layer may be patterned (forming protection pattern BP) to form openings and the base contact pads 12a may be formed in the openings of the protection pattern BP. Some or all of the base contact pads 12a may contact and/or electrically connect with corresponding wires of the wiring structure of body 11a to provide signal and power connections to the integrated circuit formed therein.

Preliminary penetration electrodes 13a may be formed in the wafer W in such a configuration that the preliminary penetration electrodes 13a may extend from a top surface of the wafer W and part way into the body of wafer W. Top portions of the preliminary penetration electrodes 13a may contact a corresponding base contact pad 12a. For example, the preliminary penetration electrode 13a may comprise a low resistive conductive material such as copper (Cu), aluminum (Al) and lead (Pb). The preliminary penetration electrodes 13a may be TSVs and may be formed by conventional TSV manufacturing processes, such as with a damascene process, including forming via holes within the wafer W and depositing a metal layer via a CVD process within the via holes and on the surface of the wafer and planarizing the resulting structure to remove the metal on the surface of the wafer W except within the via holes (leaving conductive vias in the via holes, corresponding to the TSVs/preliminary penetration electrodes 13a). A base protection layer may be formed on the wafer W into which the preliminary penetration electrode 13a may be inserted by a spin coating process. Then, the base protection layer may be patterned to form the base protection pattern BP having a corresponding opening corresponding to each of the base contact pads 12a. Some of the openings may expose a corresponding preliminary penetration electrode 13a. Then, the base contact pads 12a may be formed in the openings of the base protection pattern BP to contact respective the preliminary penetration electrodes 13a. For example, the base contact pads 12a may be formed by second a damascene process as described with respect to formation of the preliminary penetration electrodes 13a (TSVs). In some examples, the base contact pads 12a and preliminary penetration electrodes 13a may be formed with a dual damascene process in which a metal layer is deposited to fill both the conductive vias of the preliminary penetration electrodes 13a and the openings of the base protection pattern BP, which is then planarized to form base contact pads 12a and preliminary penetration electrodes 13a.

In the present example embodiment, an additional wafer carrier or an additional wafer support system (WSS) is not used for stacking an additional die on the wafer W.

The wafer W having the base contact pads 12a and the base protection pattern BP may be loaded into a die stack apparatus (not shown) and the additional dies may be individually stacked on each undiced chip C of the wafer W, thereby performing the die stack process on the wafer W without any additional wafer carriers or wafer support substrates attached to the wafer W (e.g., adhered to the wafer W to combine with the wafer W as a permanent part of the manufactured device or a temporary part of an intermediate structure of the manufactured device).

Figure 7B:
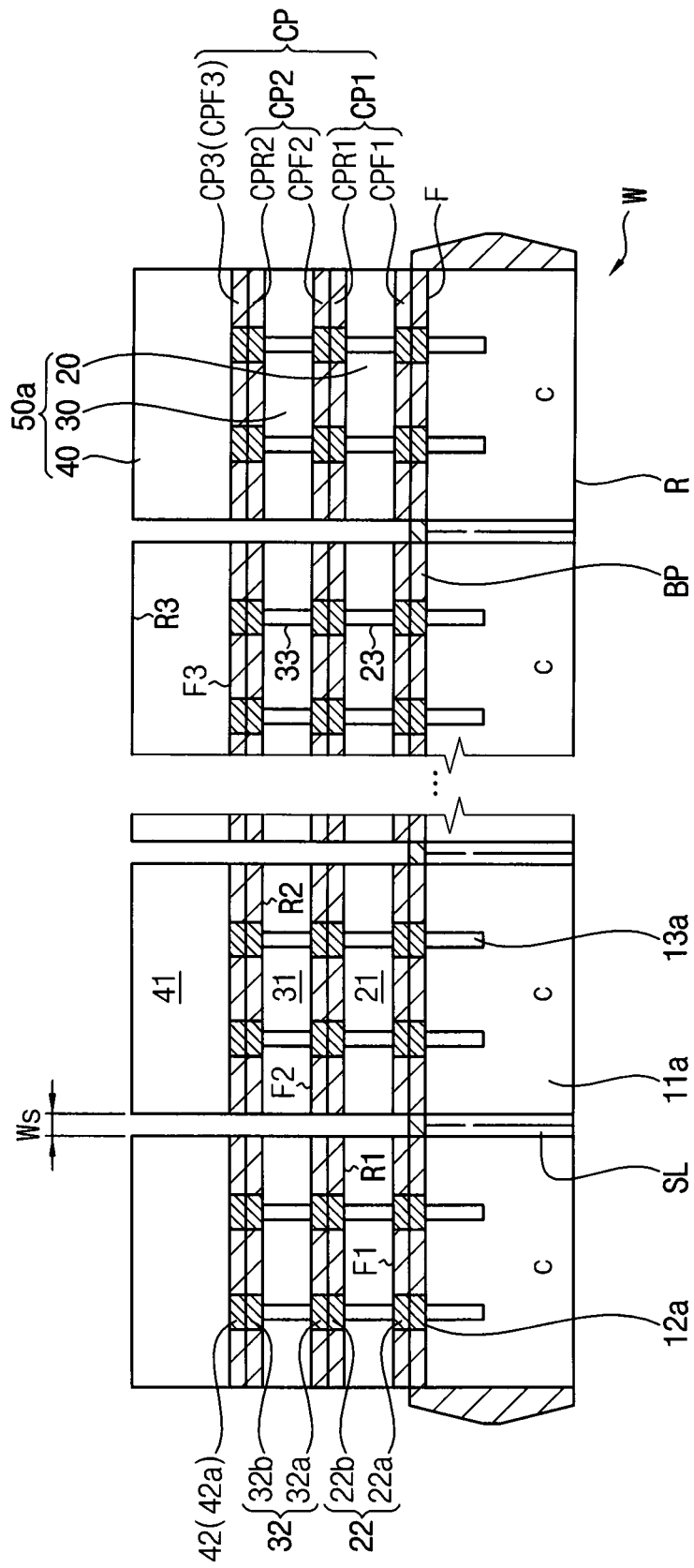

Referring to FIGS. 5 and 7B, a plurality of die stacks 50 may be formed on the wafer W by a unit of the undiced chip C in such a way that the die stacks 50 are bonded to the undiced chips C, respectively, and separated by the scribe lane SL (step S200). The die stack 50 may include a plurality of component dies 20, 30 and 40 and each component die 20, 30 and 40 may include component contact pads insulated from each other by a component protection pattern CP. Thus, the neighboring die stacks 50 may be spaced apart from each other by a lane width Ws of die stack separation lanes overlying and parallel to the scribe lanes SL.

A plurality of first, second and third component dies 20, 30 and 40 may be sequentially stacked on the wafer W by the chip C, thereby forming a preliminary die stack 50a on the wafer W by the chip C.

A plurality of dies (e.g., semiconductor chips) (e.g., obtained by singulation from a wafer using a conventional sawing process) may be stored in a die source (not shown) of the die stack apparatus. The component dies may be individually picked up from the die source and may be individually stacked on each undiced chip C of the wafer W by a die transfer such as a robot arm. The first, second and the third component dies 20, 30 and 40 may be the picked dies from the die source.

The first component die 20 may include a first component body 21 in which a plurality of transistor structures (not shown) and first wiring structures (not shown) are formed and first component contact pads 22 formed on the first component body 21 and connected to the first wiring structures. The first component penetration electrodes 23 may be connected to corresponding first component contact pads 22. The first component contact pads 22 may be insulated from each other by first component protection patterns CP1. The first component contact pads 22 may include first front component contact pads 22a on a front surface of the first component body 21 and first rear component contact pads 22b on a rear surface of the first component body 21. The plurality of the first front component contact pads 22a may be separated from one another by a first front component protection pattern CPF1 and the plurality of the first rear component contact pads 22b may be separated from one another by a first rear component protection pattern CPR1. Pairs of first front component contact pads 22a and the first rear component contact pads 22b may be connected with each other by corresponding first component penetration electrodes 23.

The first front component contact pads 22a and the first front component protection pattern CPF1 may be formed on the front surface F1 of the first component body 21 as part of the semiconductor manufacturing processes for manufacturing the first component die 20. The first rear component contact pads 22b and the first rear component protection pattern CPR1 may be formed on the rear surface of the first component body 21 by processing the rear surface R1 of the first component body 21 after completing the semiconductor manufacturing process to the front surface F1 of the first component body 21.

In the present example embodiment, the first component die 20 may be bonded to the wafer W with a flip chip bonding process in such a way that the front surface F1 of the first component body 21 faces the front surface F of the wafer W. Particularly, the first front component contact pad 22a may contact the base contact pad 12a and the first front component protection pattern CPF1 may contact the base protection pattern BP.

In some examples, the second component die 30 may have substantially the same structures as the first component die 20. Thus, the second component die 30 may include a second component body 31 in which a plurality of transistor structures (not shown) and second wiring structures (not shown) are formed and second component contact pads 32 formed on the second component body 31 and connected to the second wiring structures.

Second component penetration electrodes 33 may be connected to corresponding second component contact pads 32. The second component contact pads 32 may be insulated from each other by a second component protection pattern CP2. The second component contact pads 32 may include second front component contact pads 32a on a front surface F2 of the second component body 31 and second rear component contact pads 32b on a rear surface R2 of the second component body 31. The plurality of the second front component contact pads 32a may be separated from one another by a second front component protection pattern CPF2 and the plurality of the second rear component contact pads 32b may be separated from one another by a second rear component protection pattern CPR2. Pairs of the second front component contact pads 32a and the second rear component contact pads 32b may be connected with each other by corresponding second component penetration electrodes 33.

The second front component contact pads 32a and the second front component protection pattern CPF2 may be formed on the front surface F2 of the second component body 31 as part of the semiconductor manufacturing processes for manufacturing the second component die 30. The second rear component contact pads 32b and the second rear component protection pattern CPR2 may be formed on the rear surface R2 of the second component body 31 by processing the rear surface R2 of the second component body 31 after completing the semiconductor manufacturing process to the front surface F2 of the second component body 31.

In the present example embodiment, the second component die 30 may be bonded to the first component die 20 in such a way that the front surface F2 of the second component body 31 faces the rear surface R1 of the first component body 21. Particularly, the second front component contact pads 32a may contact corresponding first rear contact pads 22b and the second front component protection pattern CPF2 may contact the first rear component protection pattern CPR1.

The third component die 40 may be the uppermost die of the die stack 50. The third component die 40 may include a third component body 41 in which a plurality of transistor structures (not shown) and second wiring structures (not shown) are formed and third component contact pads 42 that formed on the third component body 41 and connected to the second wiring structures. Since a thinning process is to be conducted to a rear surface R3 of the third component body 41 after a wafer molding process (as described in detail hereafter), rear component contact pads and third rear component protection pattern may not be provided with the third component body 41. Further, third component penetration electrodes may not be provided with the third component body 41. However, it will be appreciated that the invention may include such additional structure.

Thus, the third component contact pads 42 may only include third front component contact pads 42a on a front surface F3 of the third component body 41. The plurality of the third component contact pads 42 may be insulated from each other by a third component protection pattern CP3. In the same way, the third component protection pattern CP3 may only include a third front component protection pattern CPF3 on the front surface F3 of the third component body 41.

In the present example embodiment, the third component die 40 may be bonded to the second component die 30 in such a way that the front surface F3 of the third component body 41 faces the rear surface R2 of the second component body 31. Particularly, the third front component contact pads 42a may contact corresponding second rear contact pads 32b and the third front component protection pattern CPF3 may contact the second rear component protection pattern CPR2.

The first, the second and the third component dies 20, 30 and 40 may have the same width in latitudinal and longitudinal (horizontal) directions (e.g., parallel to the upper surface of the wafer W in row and column directions), so that neighboring preliminary die stacks 50a may be spaced apart from each other by the lane width Ws of die stack separation lanes overlying and parallel to the scribe lanes SL in the latitudinal and the longitudinal directions of the wafer W (e.g., the die stack separation lanes extending horizontally in row and column directions).

Figure 7C:
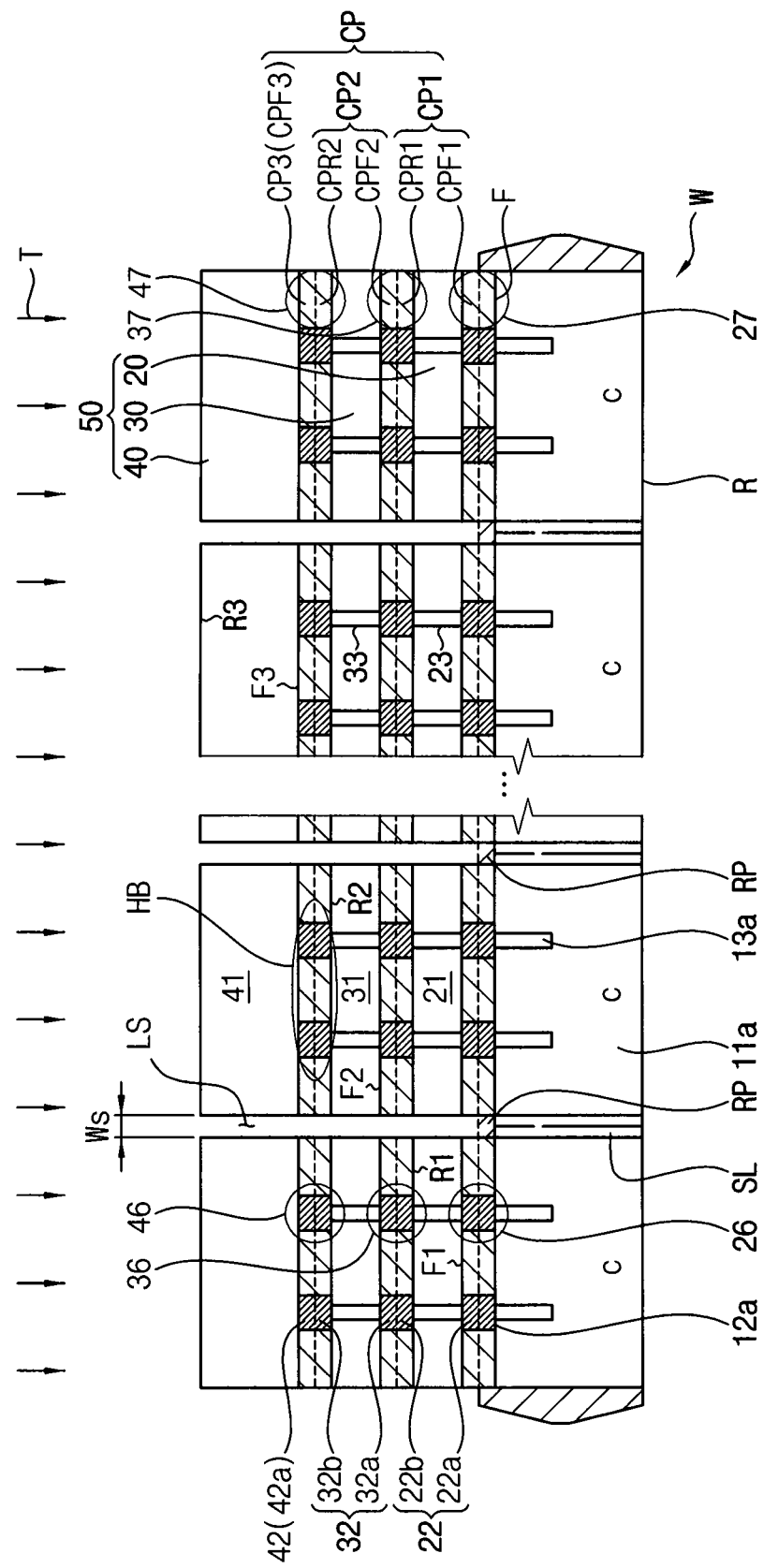

Referring to FIG. 5 and FIG. 7C, a thermal compression bonding process T may be conducted to the wafer W having the preliminary die stack 50a, thereby forming a plurality of die stacks 50 on the wafer W.

The base contact pads 12a, the first component contact pads 22, the second component contact pads 32 and the third component contact pads 42 may be formed of the same conductive materials, such as copper (Cu), and the base protection pattern BP, the first component protection pattern CP1, the second component protection pattern CP2 and the third component protection pattern CP3 may be formed of the same insulation materials, such as silicon oxide.

In the present example embodiment, the bonding between the contact pads 12a, 22, 32 and 42 and the bonding between the protection patterns BP, CP1, CP2 and CP3 may be simultaneously conducted by the same thermal compression bonding process T.

The copper (Cu) of the contact pads 12a, 22, 32 and 42 may be melted and conjugated in the thermal compression bonding process T and may be formed into a plurality of bonded contacts 26, 36 and 46. For example, the copper (Cu) of the base contact pad 12a and the first front component contact pad 22a may be melted and conjugated in the thermal compression bonding process T into a first bonded contact 26 by which the wafer W and the first component die 20 may be bonded to each other. In addition, the first rear component contact pad 22b and the second front component contact pad 32a may be melted and conjugated into a second bonded contact 36 by which the first component die 20 and the second component die 30 may be bonded to each other, and the second rear component contact pad 32b and the third front component contact pad 42a may be melted and conjugated into a third bonded contact 46 by which the second component die 30 and the third component die 40 may be bonded to each other.

Further, the insulation materials of the base protection pattern BP and the component protection patterns CP1, CP2 and CP3 may be melted and conjugated by the same thermal compression bonding process T and may be formed into a plurality of bonded patterns 27, 37 and 47. For example, the insulation materials of the base protection pattern BP and the first front component protection pattern CPF1 may be melted and conjugated in the thermal compression bonding process T into a first bonded pattern 27 for bonding the base die 10 and the first component die 20. In addition, the first rear component protection pattern CPR1 and the second front component protection pattern CPF2 may be melted and conjugated into a second bonded pattern 37 by which the first component die 20 and the second component die 30 may be bonded to each other, and the second rear component protection pattern CPR2 and the third front component protection pattern CPF3 may be melted and conjugated into a third bonded pattern 47 by which the second component die 30 and the third component die 40 may be bonded to each other. In such a case, some of the base protection pattern BP may not be formed into the bonded pattern at the scribe lane SL and a residual base protection pattern RP may remain on the wafer W along the scribe lane SL.

Thus, the wafer W and the first component die 20 may be directly bonded to each other by the metal-oxide hybrid bonding process without any gap fill molds and/or any bonding adhesives therebetween. In the same way, the first die 20 and the second die 30 may be directly bonded to each other by the same metal-oxide hybrid bonding process and the second die 20 and the third die 30 may be may be directly bonded to each other by the same metal-oxide hybrid bonding process. Accordingly, a die stack 50 may be formed on the wafer W in such a way that the die stack 50 may be directly bonded to the wafer W by the undiced chip C without any gap fill molds and/or any bonding adhesives therebetween. That is, the die stack 50 may be bonded to the wafer W in the conductive-insulative hybrid bonding structure HB and the component dies 20, 30 and 40 may be bonded to each other in the conductive-insulative hybrid bonding structure HB.

Thus, since no vertical spacing need be provided between the wafer W and the die stack 50 and between the component dies in the die stack 50, the gap fill process for filling the absent vertical spacing may be omitted in the process for forming the die stack 50 on the wafer W. Therefore, related gap fill defects may be avoided in the die stack structure 90 and the efficiency of the packaging process may be improved due to the omission of the gap fill process.

Particularly, when the first, the second and the third component dies 20, 30 and 40 may have the same size or widths (e.g., dimensions shown in the plan view of FIG. 6), the production yield of the die stack structure 90 may be remarkably increased due to the hybrid bonding process. According to the conventional packaging process for forming the die stack structure, the same-sized die stack is spaced apart by the lane width Ws of die stack separation lanes overlying and parallel to the scribe lanes SL and the gap fill mold is frequently extruded from gaps formed from vertical spacings between adjacent dies. The extruded gap fill mold penetrates through to the neighboring dies of the die stack, which may cause the gap fill defects within the die stack structure. To prevent the above extraction and penetration of the gap fill mold, it has been suggested that the neighboring same-sized die stacks be spaced apart from each other by a gap distance greater than the lane width Ws. However, a larger gap distance between the neighboring same-sized die stacks significantly reduces the production yield of the die stack structure. However, when no vertical spacing is generated between neighboring ones of the vertically stacked dies by the direct hybrid bonding process, the yield reduction and the gap fill defects may not occur in spite of the same-sized dies of the die stack 50 (in which the component dies 20, 30 and 40 have the same widths such as same footprint with respect to a top down view).

Figure 7D:
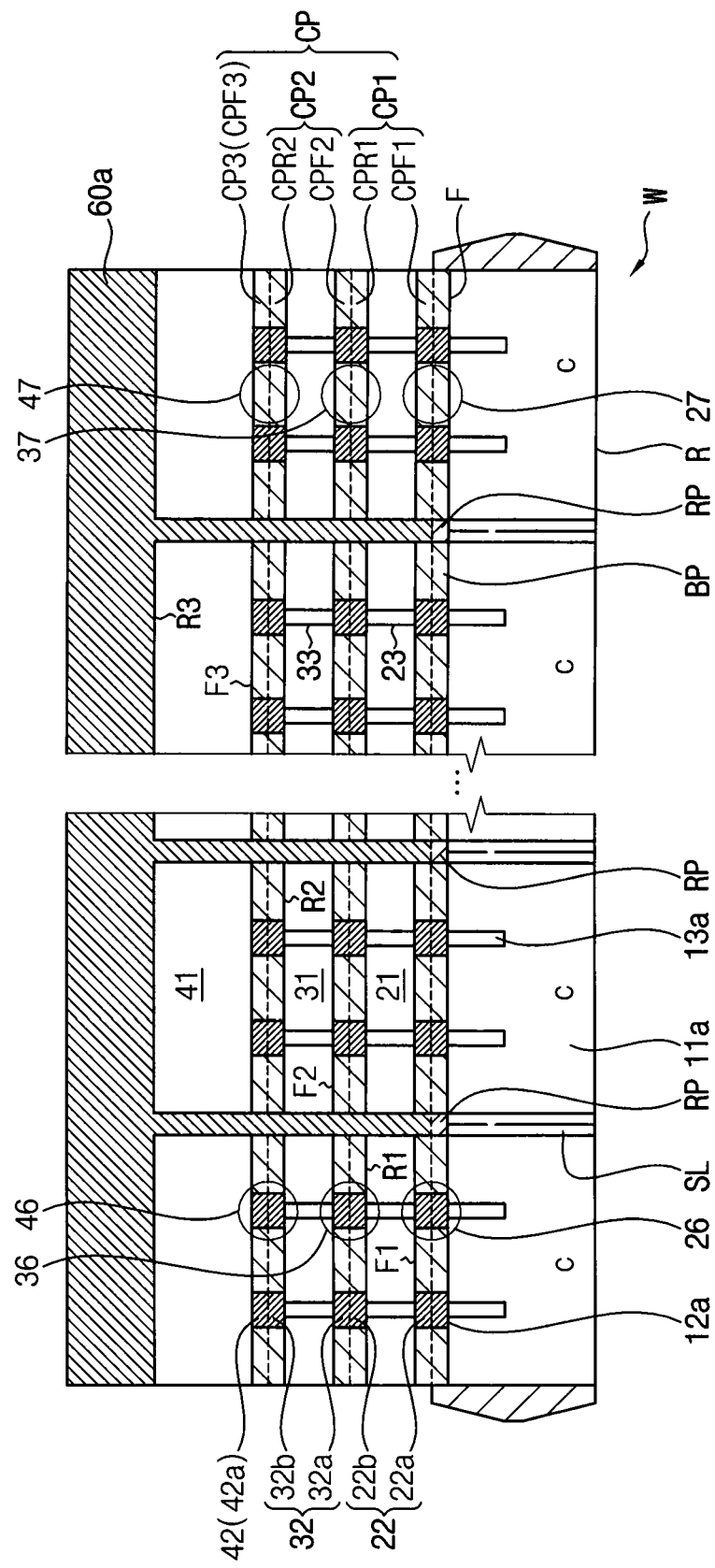
Figure 7E:
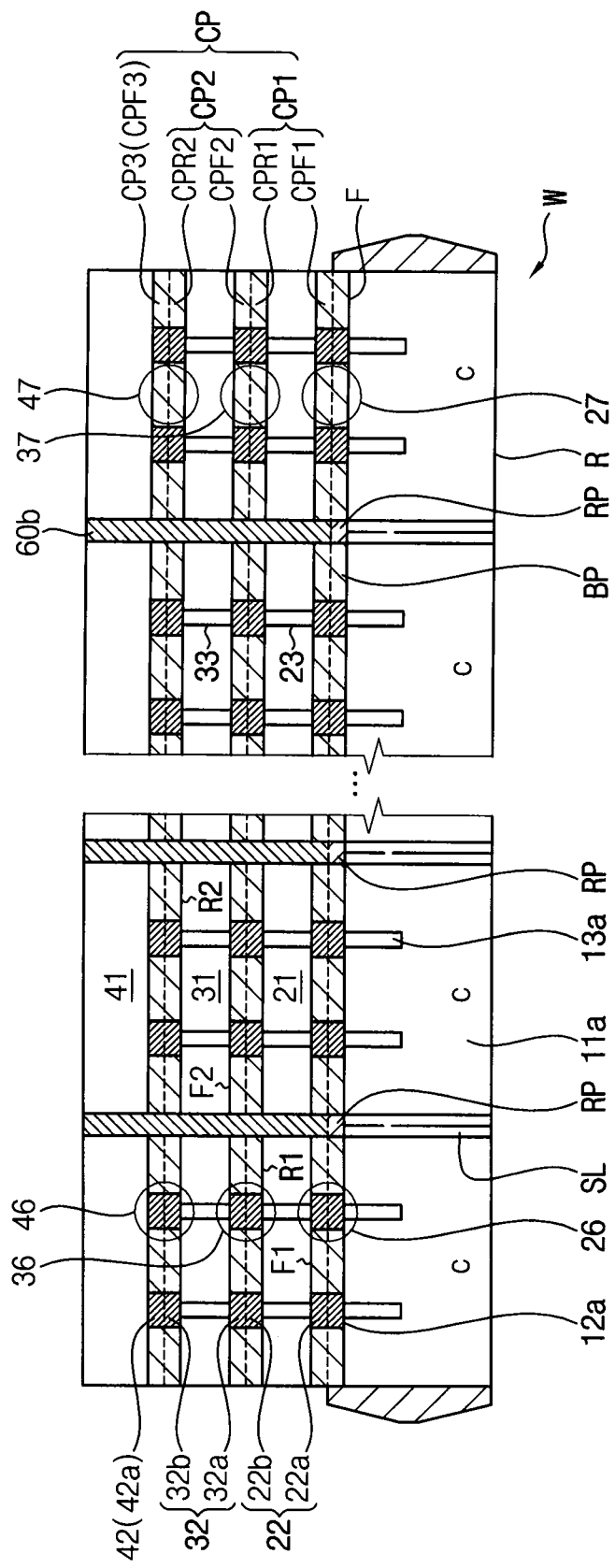

Referring to FIGS. 5 and 7D to 7E, a stack mold 60*a* may be formed in a lane space LS of the die stack separation lanes between the neighboring die stacks 50 that extend in parallel above and along corresponding scribe lanes SL. The die stack 50 may be combined to and attached to the wafer W by the stack mold 60 (step S300).

As shown in FIG. 7D, a resin compound such as an epoxy mold compound (EMC) may be coated on the die stacks 50 to a sufficient thickness to fill up the lane space LS that may be defined by the neighboring die stacks 50 and the wafer W corresponding to the scribe lane SL, thereby forming the stack mold 60*a* on the die stack 50.

Thus, the stack mold 60*a* may be formed on the die stacks 50 across a whole wafer W. In the present example embodiment, since the wafer W (including a crystalline semiconductor substrate, such as a silicon substrate) may act as a substrate for the die stacks 50, the stack mold 60*a* may be a wafer level mold covering the die stacks 50 over the upper surface of the wafer W.

Then, a planarization process and a thinning process may be sequentially conducted to a rear portion of the third component die 40 as shown in FIG. 7E, thereby forming a grid shaped stack mold 60*b* separated by the lane space LS. The grid shaped stack mold 60*b* may form a rectilinear grid (e.g., with respect top down view of FIG. 6 and corresponding to the grid shown in FIG. 6 formed by scribe lines SL) with each grid line of the rectilinear grid being formed by portion of grid shaped stack mold 60*b* in a lane of the die stack separation lanes and each cell of the grid having a die stack 50 formed therein.) A thickness of the third die 40 and the grid shaped stack mold 60*b* may be reduced by the thinning process.

For example, a planarization process (e.g., CMP) may be applied to the stack mold 60*a* by using a slurry having a high abrasion ratio with respect to the resin compound until a top surfaces of the third component dies 40 are exposed. After the top surfaces of the third component dies 40 are exposed, the stack mold 60*a* may just remain in the lane space LS and the upper surface of the stack mold 60*a* may be coplanar with (and include) the top surfaces of the third component dies 40. Thus, the stack mold 60*a* may just remain in the lane spaces LS, thereby forming the grid shaped stack mold 60*b* on the residual base protection pattern RP. Thereafter, a thinning process may be conducted to the third component die 40 and the grid shaped stack mold 60*b*. Upper portions of the third component dies 40 and the grid shaped stack mold 60*b* may be uniformly removed by the thinning process, thereby reducing the height of the third component die 40 and the grid shaped stack mold 60*b*. The thinning process may also be a planarization process (e.g., CMP) using a different slurry optimized to remove upper portions of the third component dies 40.

Neighboring die stacks 50 separated by a corresponding lane space LS may be combined to and attached to each other by the grid shaped stack mold 60*b* and may be secured to the wafer W by the grid shaped stack mold 60*b*.

Figure 7F:
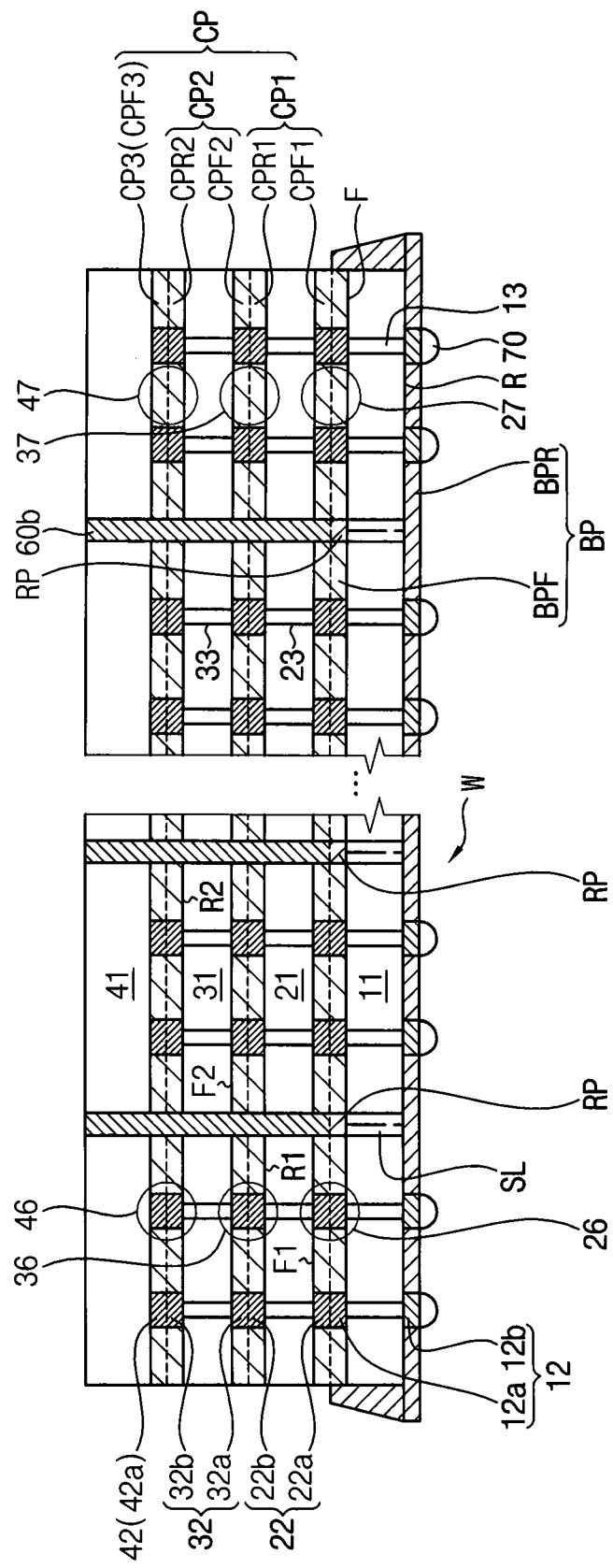

Referring to FIGS. 5 and 7F, base penetration electrodes 13 (e.g., TSVs), base rear contact pads 12*b* and base rear protection patterns BPR may be formed on a rear surface R of the wafer W (step S400).

For example, a thinning process may be performed on the rear surface of the wafer W and a backside portion of the wafer W may be removed until the preliminary penetration electrodes 13*a* are exposed, thereby forming base penetration electrodes (TSVs) 13 exposed through the rear surface of the wafer W. The thus thinned body 11*a* may correspond to base body 11.

Then, insulation materials may be coated on a whole rear surface of the thinned wafer W, to thereby form a base rear protection layer. The base rear protection layer may be patterned into the base rear protection pattern BPR having openings through which corresponding base penetration electrodes 13 are exposed. The openings of base rear protection pattern BPR may be filled with metal to form the base rear contact pads 12*b* making contact with corresponding base penetration electrodes 13. The base rear contact pads 12*b* and the base rear protection pattern BPR may be formed of the same materials as the base front contact pads 12*a* and the base front protection pattern BPF or may be formed of different materials from the base front contact pad 12*a* and the base front protection pattern BPF.

Thus, the base contact pads 12 may include the base front contact pads 12*a* and the base rear contact pads 12*b* and the base protection patterns BP may include the base front protection pattern BPF and the base rear protection pattern BPR. The base front protection pattern BPF includes the residual base protection pattern RP along the scribe lane SL.

The thermal compression bonding process may not be performed on the base rear contact pads 12*b* and the base rear protection pattern BPR, while the thermal compression boding process may be performed on the base front contact pads 12*a* and the base front protection pattern BPF.

Figure 7G:
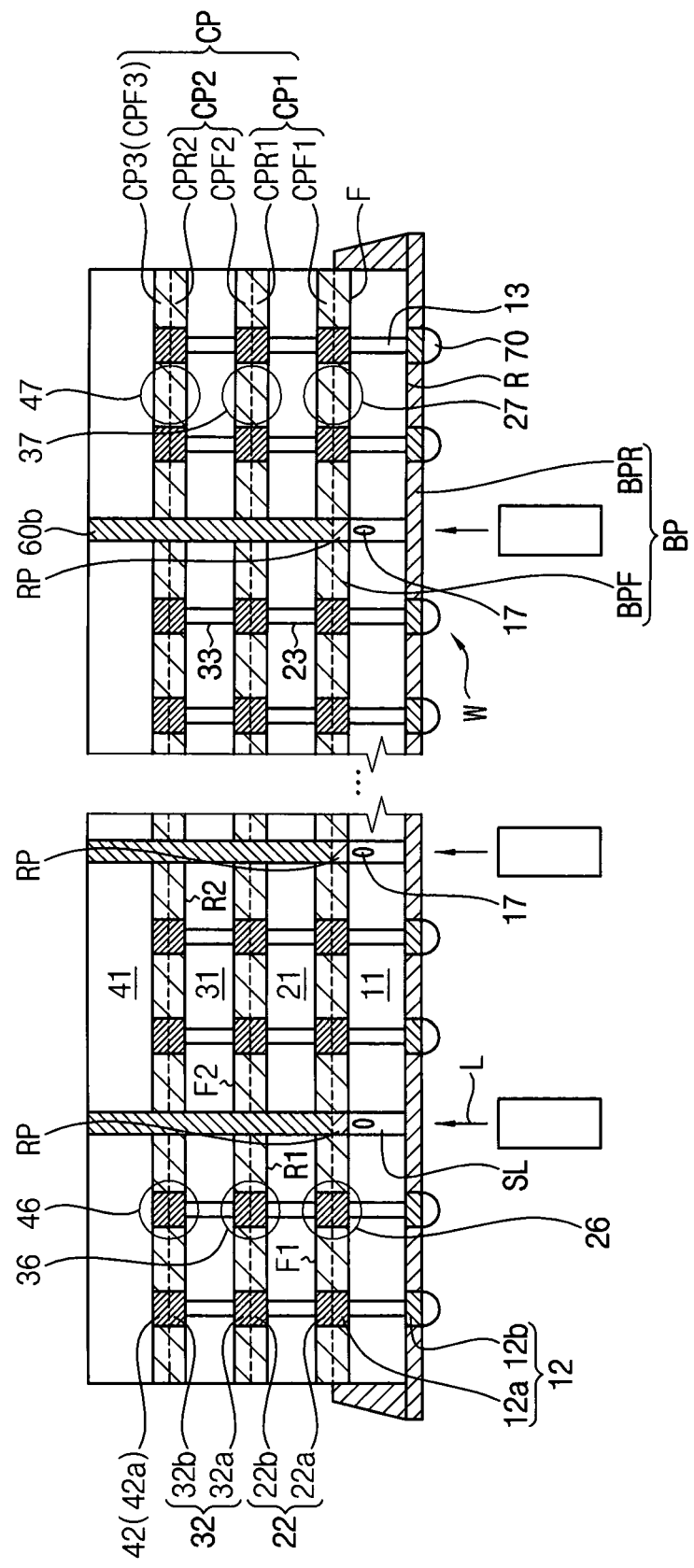

Referring to FIGS. 5 and 7G, a plurality of reforming spots 17 may be locally formed in the wafer W at locations along the scribe lanes SL (step S500). The reforming spots 17 may function as a crack source in response to an external force.

For example, a reforming light may be irradiated onto the rear surface R of the wafer W along the scribe lane SL with a predetermined intensity for a predetermined time. The reforming light may have a predetermined wavelength for locally modifying the properties of the material of the wafer W, and more particular, for modifying the properties of the crystalline substrate (e.g., silicon (Si) crystalline substrate) of the wafer W. Thus, the intensity and wavelength of the reforming light may be varied according the material of the substrate of the wafer W.

For example, a laser L may be locally irradiated onto the wafer W at a predetermined intensity along the scribe lanes SL enclosing the chips C, so that a plurality of irradiation spots 17 are formed in the substrate of the wafer W along the scribe lanes SL. For example, portions of the substrate of the wafer W corresponding to the plurality of irradiation spots 17 may be locally melted by the laser L and the material properties of substrate at the irradiation spots may be modified due to the heat and differ from remaining portions of the substrate (not subject to irradiation by the laser L) of the wafer W after cooling. Particularly, the crystalline structures of the crystalline substrate (e.g., of crystalline silicon when the substrate of the wafer W is silicon) may be partially broken or weakened in the irradiation spots in the wafer W of the scribe lane SL. Thus, when a small external force is applied to the wafer W, the wafer W may be split into pieces along the scribe lanes SL, with the pieces forming chips C. In such a case, the local reforming spots 17 may function as a crack source and the wafer W may be split along the crack direction of the crack source. Since a plurality of the reforming spots 17 may be locally arranged along the scribe lane SL, the wafer W may be split into pieces (i.e., diced) along each of the scribe lanes SL to form the chips C. Although the irradiation of the reforming light may be formed at this stage, the dicing of the wafer W may occur at a later time.

While the present example embodiment discloses that the irradiation of the reforming light is conducted prior to the sawing process to the grid shaped stack mold 60b (described below), the irradiation of the reforming light may also be conducted after the sawing the grid shaped mold 60b.

Figure 7H:
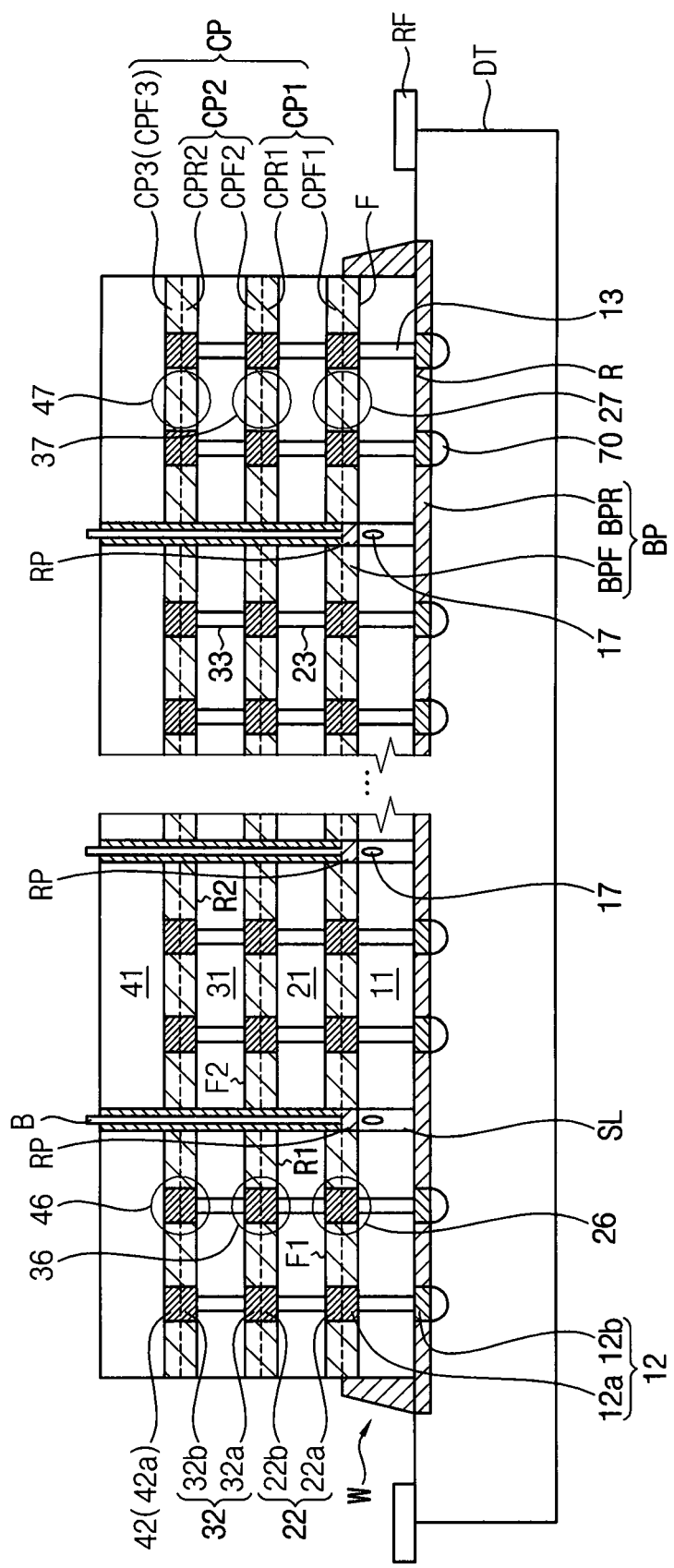
Figure 71:
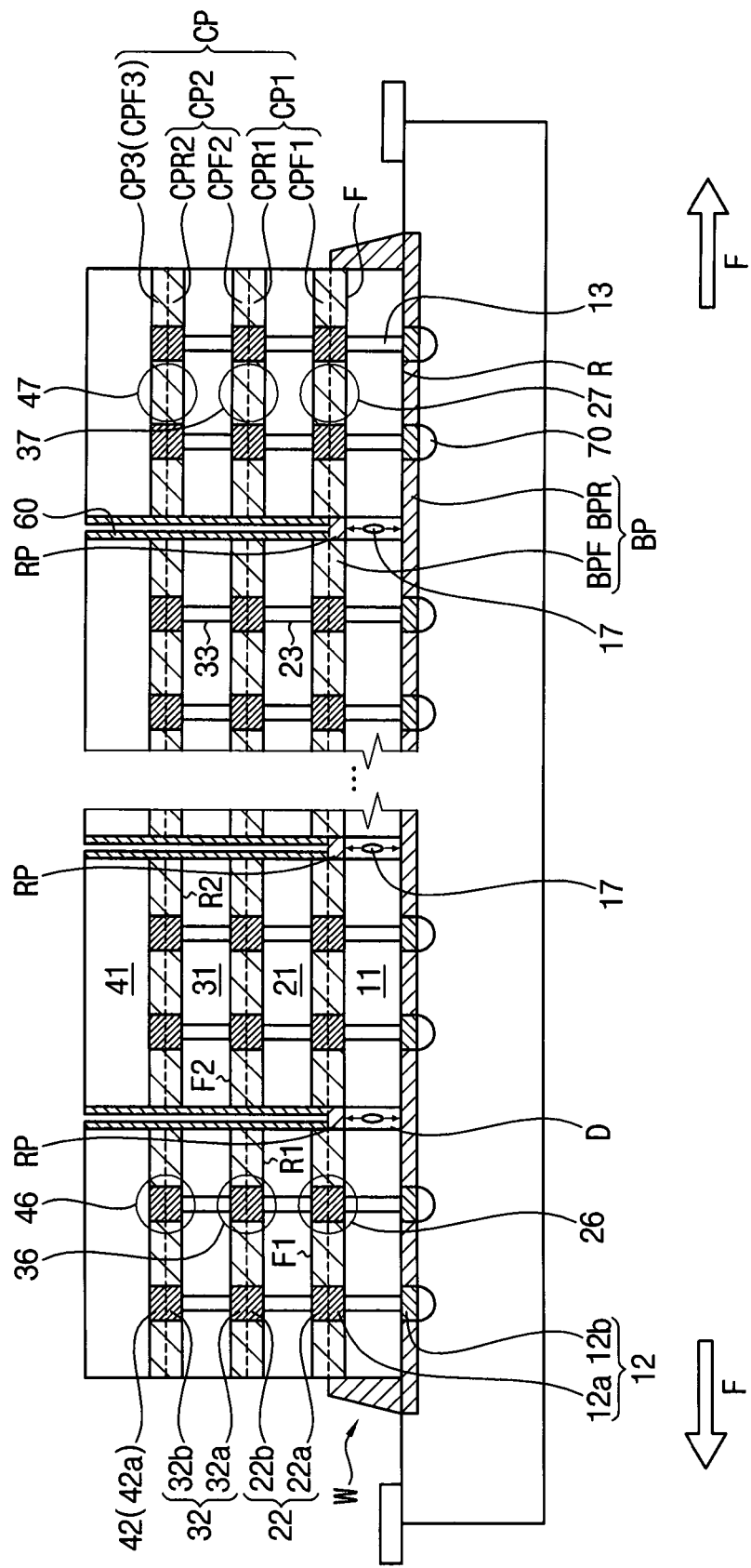

Referring to FIGS. 5 and 7H, the wafer W having the die stack 50 and the local reforming spots 17 may be loaded into a chip separator (not shown) and a mechanical sawing process may be conducted to the grid shaped stack mold 60b along the scribe lanes SL (step S600).

For example, the wafer W having the die stack 50 may be mounted on a support of the chip separator in such a configuration that a dicing tape may be secured to a ring frame RF and the rear surface of the wafer W may be attached to and adhere to the dicing tape DT. Since the support may be positioned at a central portion of the ring frame RF, the wafer W may be mounted at the central portion of the ring frame. The dicing tape may be interposed between the support and the rear surface of the wafer W.

Then, a rotating blade(s) B of the saw of the chip separator may move along each of the scribe lanes SL and thus the grid shaped stack mold 60b may be cut along the central portion of each of the grid lines of the grid shaped stack mold 60b, e.g., along a central portion of the lane space LS of each of the die stack separation lanes until the residual base protection pattern RP may be exposed through the lane space LS.

Thus, the die stacks 50, which had been combined with each other by the grid shaped stack mold 60b, may be separated from each other by a unit of the undiced chip C of the wafer W (while the chips C remain connected to each other and part of wafer W). That is, the die stacks 50 may be individually separated by a unit of the undiced chip C by the blade sawing process.

Since the blade sawing process may cut the grid shaped stack mold 60b mechanically by using the rotating blade B, portions of the stack mold 60b on the side surfaces SS of the die stack 50 may not be removed in the blade sawing process. Thus, the sawed stack mold 60b may remain unevenly and roughly on the side surfaces SS of the die stack 50 in a bulgy and hollow shape (e.g., with protrusions and depressions), thereby forming the uneven residual mold 60 on the side surfaces SS of the die stack 50, such as discussed with respect to FIG. 1 (with the residual mold 60 continuously formed on the side surface SS of the die stack 50) or such as described with respect to FIG. 2 (with the residual mold 60 discontinuously formed on the side surface SS of the die stack 50 with side surfaces SS of the die stack exposed with respect to the residual mold 60).

While the present example embodiment discloses that the blade sawing process is conducted for cutting the grid shaped stack mold 60b, other mechanical sawing processes may also be used for cutting the stack mold 60b in the lane space LS (which may be chosen according to the composition of the stack mold 60b).

The blade sawing process may be controlled in such a way that the separated stack mold 60b may be fully removed from some portions of the side surface SS of the die stack 50. Thus, the residual mold 60 may be discontinuously formed on the side surface SS of the die stack 50 and the side surface SS of the die stack 50 may be partially exposed through the discontinuous residual mold 60. That is, the exposed surface ES may be formed on the side surface SS of the die stack 50 as shown and described with respect to FIG. 2.

Referring to FIGS. 5 and 7I, the wafer W may be diced by applying an external force F to the wafer W having the reforming spots 17, thereby separating the wafer W into chips C (pieces of the wafer W) with the die stack 50 bonded to each chip C. Each chip C may function as a base die to which a corresponding die stack 50 is bonded.

Since the grid shaped stack mold 60b has been cut by the blade sawing process, the thickness of the substrate of the wafer W has been reduced by the thinning process and a plurality of the reforming spots have been arranged in the wafer W along the scribe lane SL, only a small external force may be needed to separate the wafer W into the chips C.

Since the wafer W may be attached to the dicing tape DT, an expansion of the ring frame RF may apply the external force F to the dicing tape DT and the external force F may be applied by the ring frame RF to the wafer W via the dicing tape DT. The external force may expand the cracks of the reforming spots 17. In such a case, the cracks of the reforming spots may grow in a predetermined crack direction and thus the wafer W may be split in the crack direction. Since a plurality of the reforming spots 17 may be locally arranged along each of the scribe lanes SL, the wafer W may be split along the scribe lanes SL and be separated into pieces to form individual chips C.

Since a die stack 50 may be still bonded to a corresponding chip C, each individual chip C may still be combined to and attached to the die stack 50 to thereby form the die stack structure (90, 91). In such a case, the chip C to which the die stack 50 may be bonded may be provided as the base die 10 of the die stack structure (90, 91).

In addition, since the cracks of the reforming spots 17 may grow in a predetermined crack direction along a corresponding scribe lane SL and the wafer W may be split in the crack direction, the cut face of the wafer W may extend in a principal crack direction D.

Thus, the side surface S of the base die 10 may be formed to be flat and uniform, while the side surface SS of the die stack 50 may be covered by the uneven residual mold 60. Thus, the die stack structure 90 may have different surface roughness between a lower side portion and an upper side portion.

When the die stack structure 90 may be combined with a package substrate (e.g., a circuit board) for forming the semiconductor package, the adhesive strength of the die stack structure 90 to the package substrate may be varied by the surface roughness of the side portions of the die stack structure 90. Thus, the roughness of the residual mold 60 may be controlled in view of a desired adhesive strength of the die stack structure 90 to the package substrate.

Particularly, since the wafer W may be split in the principal crack direction D, the wafer W of the scribe lane SL may remain around the peripheral portion of the base die 10. Thus, the base width W1 of the base die 10 may be greater than the stack width W2 of the die stack 50, and an upper surface of the edge portion of the base die 10 may be exposed around the peripheral portion of the die stack structure 90. The residual mold 60 may contact the exposed surface of the edge portion of the base die 10.

Thus, the die stack 50 may also be bonded to the base die by the contact of the residual mold 60 to the edge surface of the base die 10 as well as the metal-oxide hybrid boding, thereby reinforcing the adhesive strength of the die stack 50 to the base die 10.

According to the example embodiments of the present inventive concept, the base die 10 and the die stack 50 may be directly bonded with the hybrid bonding structure HB without any gap fill molds, nor use of bonding adhesives and bonding structures between the base die 10 and the die stack 50, so that no vertical spacing need be generated between the base die 10 and the die stack 50. In the same way, each component dies 20, 30 and 40 of the die stack 50 may be bonded with the hybrid bonding structure HB without any gap fill molds, nor use of bonding adhesives and bonding structures between the component dies, so that no vertical spacings need be interposed between neighboring ones the component dies 20, 30 and 40. Thus the gap fill defects of the die stack structure 90 may be avoided or minimized due to the hybrid bonding structure, thereby increasing the reliability and stability of the semiconductor package 500 having the die stack structure 90.

In addition, since no such vertical spacing need be provided within the die stack structure 90, the height of the die stack structure 90 may be reduced as much as the size of the absent vertical spacing(s). Thus, the form factor of the die stack structure 90 may be improved due to the hybrid bonding structure.

Particularly, the die stack 50 may be separated by the mechanical sawing process and the chip C may be separated by an optical sawing process. The cracks of the reforming spots may grow in the crack direction and the wafer W may be split in the crack direction. Thus, the side surface S of the base die 10 may be formed to be flat and uniform, while the side surface SS of the die stack 50 may be covered by the uneven residual mold 60. Thus, the die stack structure 90 may have different surface roughness between a lower side portion and an upper side portion. The roughness of the residual mold 60 may be controlled in view of the adhesive strength of the die stack structure 90 to the circuit board.

Further, the wafer W may be loaded into a die stack apparatus (not shown) and the additional dies may be individually stacked on each undiced chip C of the wafer W, thereby conducting the die stack process on the wafer W without any additional wafer carriers or the wafer support systems.

The foregoing is illustrative of example embodiments and is not to be construed as limiting thereof. Although a few example embodiments have been described, those skilled in the art will readily appreciate that many modifications are possible to the example embodiments without materially departing from the novel teachings and advantages of the present invention. Accordingly, all such modifications are intended to be included within the scope of the present invention as defined in the claims.

What is claimed is:

1. A die stack structure comprising:
a base die having a base contact pad insulated by a base protection pattern, the base die having a flat side surface;
a die stack directly bonded to the base die and having a plurality of component dies, each of the component dies including a component contact pad insulated by a component protection pattern; and
a residual mold unevenly arranged on a side surface of the die stack.

2. The die stack structure of claim 1, wherein the die stack includes a plurality of the component dies having substantially the same width and side surfaces of the component dies are vertically aligned with one another.

3. The die stack structure of claim 2, wherein the residual mold is continuous along the side surface of the die stack.

4. The die stack structure of claim 2, wherein the residual mold is discontinuous along the side surface of the die stack.

5. The die stack structure of claim 1, wherein the base die and the die stack are directly bonded to each other by a hybrid bonding structure in which the base contact pad and the component contact pad of the lowermost component die of the die stack are mutually adjacent and bonded to each other and the base protection pattern and the component protection pattern of the lowermost component die are mutually adjacent and bonded to each other.

6. The die stack structure of claim 5, wherein a width of the base die is greater than a width of the lowermost component die of the die stack.

7. The die stack structure of claim 5, wherein the base contact pad and the component contact pad of the lowermost component die include the same material which is one of copper (Cu), aluminum (Al) and lead (Pb), and the base protection pattern and the component protection pattern of the lowermost component die include the same material which is one of silicon oxide, silicon nitride and silicon oxynitride.

8. The die stack structure of claim 5, wherein neighboring ones of the component dies are directly bonded to each other by a hybrid bonding structure in which neighboring component contact pads contact each other and neighboring component protection patterns contact each other.

9. The die stack structure of claim 1, further comprising a base penetration electrode in contact with the base contact pad and penetrating through the base die and a component penetration electrode in contact with the component contact pad of the lowermost component die of the die stack and penetrating through the lower most component die.

10. A semiconductor package comprising:
a package substrate comprising a circuit board having an electronic circuit pattern;
a die stack structure comprising a stack of semiconductor dies, the die stack structure being arranged on the circuit board such that the die stack structure is connected to the electronic circuit pattern; and
a package mold securing the die stack structure to the circuit board,
wherein the die stack structure includes:
a base die connected to the electronic circuit pattern and having base contact pads insulated by base protection patterns and a flat side surface;
a die stack directly bonded to the base die and having a plurality of component dies on the base die, each component die including component contact pads insulated by component protection patterns; and
a residual mold unevenly arranged on a side surface of the die stack.

11. The semiconductor package of claim 10,
wherein the die stack includes a plurality of the component dies having substantially the same footprint, and
wherein side surfaces of the component dies are vertically arranged.

12. The semiconductor package of claim 10, wherein the base die and the die stack are directly bonded to each other by a hybrid bonding structure in which the base contact pads and adjacent component contact pads of the lowermost component die of the die stack are bonded to each other and the base protection patterns and adjacent component protection patterns of the lower most component die are bonded to each other.

13. The semiconductor package of claim 12, wherein neighboring ones of the component dies are directly bonded to each other by a hybrid bonding structure in which neighboring component contact pads are bonded to each other and neighboring component protection patterns are bonded to each other.

14. The semiconductor package of claim 10, wherein the die stack structure further includes base penetration electrodes in contact with corresponding ones of the base contact pads and penetrating through the base die and component penetration electrodes in contact with corresponding ones of the component contact pads and penetrating through a corresponding component die.

15. The semiconductor package of claim 14, further comprising contact terminals in contact with corresponding base contact pads and the electronic circuit pattern such that the electronic circuit pattern electrically connects with the base penetration electrodes.

16. The semiconductor package of claim 15, further comprising an under fill mold interposed between the package substrate and the die stack structure.

17. The semiconductor package of claim 10, wherein the residual mold is continuous along the side surface of the die stack.

18. The semiconductor package of claim 10, wherein the residual mold is discontinuous along the side surface of the die stack.

19. The semiconductor package of claim 10, wherein a width of the base die is greater than a width of the die stack.

20. The semiconductor package of claim 10, wherein the base die and the component dies includes one of a dynamic random access memory (DRAM) device and a flash memory device.

* * * * *